(12) United States Patent
Forrest et al.

(10) Patent No.: US 8,613,496 B2
(45) Date of Patent: Dec. 24, 2013

(54) COMPACT ORGANIC VAPOR JET PRINTING PRINT HEAD

(75) Inventors: Stephen R. Forrest, Ann Arbor, MI (US); Gregory McGraw, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 570 days.

(21) Appl. No.: 12/729,479

(22) Filed: Mar. 23, 2010

(65) Prior Publication Data

US 2010/0245479 A1 Sep. 30, 2010

Related U.S. Application Data

(60) Provisional application No. 61/211,002, filed on Mar. 25, 2009.

(51) Int. Cl.
*B41J 2/14* (2006.01)

(52) U.S. Cl.
USPC .......................................... 347/47

(58) Field of Classification Search
USPC .................. 427/421.1; 347/21, 44, 47, 83
See application file for complete search history.

(56) References Cited

U.S. PATENT DOCUMENTS

| | | | |
|---|---|---|---|
| 4,685,185 | A | 8/1987 | Boso et al. |
| 4,812,326 | A | 3/1989 | Tsukazaki et al. |
| 6,467,871 | B1 | 10/2002 | Moffat et al. |
| 7,279,704 | B2 | 10/2007 | Walters et al. |
| 2004/0048000 | A1 | 3/2004 | Shtein et al. |
| 2005/0087131 | A1 | 4/2005 | Shtein et al. |
| 2007/0057387 | A1 | 3/2007 | Moffat et al. |
| 2009/0009569 | A1* | 1/2009 | Sasaki ............................. 347/85 |

FOREIGN PATENT DOCUMENTS

EP 1427034 6/2004

OTHER PUBLICATIONS

Performance Fan Nozzle-Shank, Manufacturing, see representative figure on p. 2 of 9.*
Performance Fan Nozzle-Shank, Manufacturing, see representative Figure on p. 2 of 9, Mar. 2013.*
Clausing, J. Vac. Sci. Tech. "The Flow of Highly Rarefied Gases through Tubes of Arbitrary Length" vol. 8, No. 5, pp. 636-346.
Stanteler D. et al. "Molecular flow transmission probabilities of rectangular tubes" J. Vac. Sci. Tech. A 9 (4) Jul./Aug. 8, 1991, pp. 2378-2383.
Moore, J.H., Davis,C.C., and M.A. Coplan Building Scientific Apparatus, "Physical Principles of Mechanical Design." Westview Press; 3rd edition (2002), pp. 41-47.
Ciprian Iliescu et al. "Strategies in deep wet etching of Pyrex glass" Sensors and Actuators A 133 (2007) pp. 395-400.
G. Wallis, "Field Assisted Glass Sealing" 2(1), Electrocomponent Science and Tech, 1975, pp. 45-53.

(Continued)

*Primary Examiner* — Lisa M Solomon
(74) *Attorney, Agent, or Firm* — Morgan Lewis & Bockius LLP

(57) ABSTRACT

A first device is provided. The first device includes a print head, and a first gas source hermetically sealed to the print head. The print head further includes a first layer further comprising a plurality of apertures, each aperture having a smallest dimension of 0.5 to 500 microns. A second layer is bonded to the first layer. The second layer includes a first via in fluid communication with the first gas source and at least one of the apertures. The second layer is made of an insulating material.

16 Claims, 24 Drawing Sheets

(56) References Cited

OTHER PUBLICATIONS

K. M. Knowles et al., Anodic bonding, 51(5), International Materials Rev., 2006, vol. 51, No. 5, pp. 273-311.

International Search Report and Written Opinion corresponding to the PCT/US2010/028495 application.
International Search Report and Written Opinion corresponding to the PCT/US2010/0284956 application.

* cited by examiner

1610

1620

1630

1640

1650

1660

1670

1680

2010    2020

2110

2120

2110　　　　　　　　　　　　　　2110

COMPACT ORGANIC VAPOR JET PRINTING PRINT HEAD

This application claims priority to, and the benefit of, U.S. Provisional Application Ser. No. 61/211,002, entitled Compact OVJP Print Head, filed Mar. 25, 2009.

This invention was made with government support under DE-FC26-04NT42273 awarded by the Department of Energy. The government has certain rights in the invention.

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to the deposition of organic materials through a print head.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors.

More details on OLEDs can be found in U.S. Pat. No. 7,279,704, which is incorporated herein by reference in its entirety.

Various ways to deposit the organic materials used to fabricate organic devices are known, such as vacuum thermal evaporation, solution processing, organic vapor phase deposition, and organic vapor jet printing.

SUMMARY OF THE INVENTION

Some aspects of the invention relate to a nozzle geometry useful for organic vapor jet printing.

In one embodiment, a first device is provided. The device includes a print head. The print head further includes a first nozzle hermetically sealed to a first source of gas. The first nozzle has an aperture having a smallest dimension of 0.5 to 500 microns in a direction perpendicular to a flow direction of the first nozzle. At a distance from the aperture into the first nozzle that is 5 times the smallest dimension of the aperture of the first nozzle, the smallest dimension perpendicular to the flow direction is at least twice the smallest dimension of the aperture of the first nozzle.

The print head may include a plurality, of first nozzles hermetically sealed to the first source of gas.

The print head may include a second nozzle hermetically sealed to a second source of gas different from the first source of gas. The second nozzle has an aperture having a smallest dimension of 0.5 to 500 microns in a direction perpendicular to a flow direction of the second nozzle. At a distance from the aperture into the second nozzle that is 5 times the smallest dimension of the aperture of the second nozzle, the smallest dimension perpendicular to the flow direction is at least twice the smallest dimension of the aperture of the second nozzle.

The print head may include a third nozzle hermetically sealed to a third source of gas different from the first and second sources of gas. The third nozzle has an aperture having a smallest dimension of 0.5 to 500 microns in a direction perpendicular to a flow direction of the third nozzle. At a distance from the aperture into the third nozzle that is 5 times the smallest dimension of the aperture of the third nozzle, the smallest dimension perpendicular to the flow direction is at least twice the smallest dimension of the aperture of the third nozzle.

The print head may comprise a plurality of first nozzles hermetically sealed to the first source of gas, a plurality of second nozzles hermetically sealed to the second source of gas, and/or a plurality of third nozzles hermetically sealed to the third source of gas.

There are a number of different ways that a nozzle may meet the geometrical considerations discussed above. The first nozzle may a constant cross section from the aperture to a distance from the aperture into the first nozzle that is 2 times the smallest dimension of the aperture of the first nozzle. The smallest dimension of the first nozzle in a direction perpendicular to a flow direction of the first nozzle may continuously increase with distance from the aperture of the first nozzle for distances in the range of zero to 2 times the smallest dimension of the aperture of the first nozzle. The smallest dimension of the first nozzle in a direction perpendicular to a flow direction of the first nozzle may increases linearly with distance from the aperture of the first nozzle for distances in the range of zero to 2 times the smallest dimension of the aperture of the first nozzle.

The nozzle may be formed from a variety of materials. Silicon is particularly preferred. Metals and ceramics are also preferred Preferred ranges for the smallest dimension of the aperture of the first nozzle in a direction perpendicular to a flow direction of the first nozzle include 100 to 500 microns, 20 to 100 microns, and 0.5 to 20 microns.

Preferred shapes for the cross section of the first nozzle perpendicular to the flow direction of the first nozzle include circular and rectangular.

The first device may be used with multiple gas streams, which may carry different organic materials. The first device preferably includes first and second sources of gas, and a thermal barrier disposed between the print head and the first and second sources of gas. Preferably, independently controllable heat sources are provided for each of the print head, the first source of gas, and the second source of gas.

The first device may be used with gas streams that may carry multiple organic materials in each gas stream, where different organic materials may be sublimated in different chambers having independent temperature control. Preferably, the first source of gas includes a first sublimation chamber and a second sublimation chamber. The first gas source may be separated from the print head by a thermal barrier disposed between the print head and the first source of gas. Independently controllable heat sources may be provided for each of the print head, the first sublimation chamber and the second sublimation chamber.

The first device may be used to eject a jet of gas from the first nozzle, as well as the other nozzles.

While the first device is being used to eject jets of gas from the nozzles, different and independently controllable temperatures may be maintained at the print head and the first, second, and/or third sources of gas. In one embodiment, the gas provided by the first source of gas includes a first organic material having a first sublimation temperature, and the gas provided by the second source of gas includes a second organic material having a second sublimation temperature at least 10 degrees Celsius different from the sublimation temperature of the first organic material.

Some aspects of the invention relate to a microfluidic print head useful for organic vapor jet printing.

In one embodiment, a first device is provided. The first device includes a print head, and a first gas source hermetically sealed to the print head. The print head further includes a first layer further comprising a plurality of apertures, each aperture having a smallest dimension of 0.5 to 500 microns. A second layer is bonded to the first layer. The second layer includes a first via in fluid communication with the first gas source and at least one of the apertures. The second layer is made of an insulating material.

The first layer of the first device may include a channel that provides fluid communication within the first layer between the first via of the second layer and apertures of the first layer. The second layer of the first device may also, or instead, include a channel that provides fluid communication within the second layer between the first via of the second layer and apertures of the first layer. The first layer and/or second layers may further include a heat source.

The first device may include a third layer disposed between the first and second layers and bonded to the first layer and the second layer. The third layer may include a channel that provides fluid communication between the first via of the second layer and apertures of the first layer. The third layer may further include a heat source.

A plurality of apertures may be in fluid communication with the first gas source.

The first device may further include a second gas source hermetically sealed to the print head. The first via of the second layer may be in fluid communication with a first group of apertures of the first layer. The second layer may further include a second via in fluid communication with the second gas source and a second group of apertures of the first layer. The first device may further include a third gas source hermetically sealed to the print head. The second layer may further include a third via in fluid communication with the third gas source and a third group of apertures of the first layer.

A gas source, such as the first gas source or any other gas source may include multiple organic sources. Multiple vias connected to different gas sources may be in fluid communication with the same aperture, resulting in a mix of gases at the aperture. For example, the first via may be in fluid communication with a first organic source, while a second via is in fluid communication with a second organic source. The first and second vias may both in fluid communication with a first group of apertures of the first layer. The print head, the first organic source and the second organic source each have independently controllable heat sources.

The first device may further include a first valve for controlling gas flow to the first organic source and a second valve for controlling gas flow to the second organic source. The first and second valves may be thermally insulated from the heat sources.

The first layer is preferably formed from silicon.

The first layer is preferably bonded to the second layer using a bond selected from the group consisting of a fusion bond, cold weld, an anodic bond, and a eutectic bond. If additional layers are present in the print head, such as a third layer or other layers, they are preferably bonded using these types of bonds. In one embodiment, it is preferred that the first and second layers are bonded to each other using an anodic bond. In another embodiment, it is preferred that a third layer is placed between the first and second layers, the first and third layers are bonded with a eutectic bond or fusion bond, and the third and second layers are bonded, preferably with an anodic bond.

The print head may further include a microelectromechanical switch adapted to block or allow fluid communication between the first via and the at least one of the apertures depending upon the state of the switch.

At least one aperture may be formed in a protrusion from the print head.

The thickness of the print head is preferably between 50 and 500 microns.

DETAILED DESCRIPTION

Figure 1:
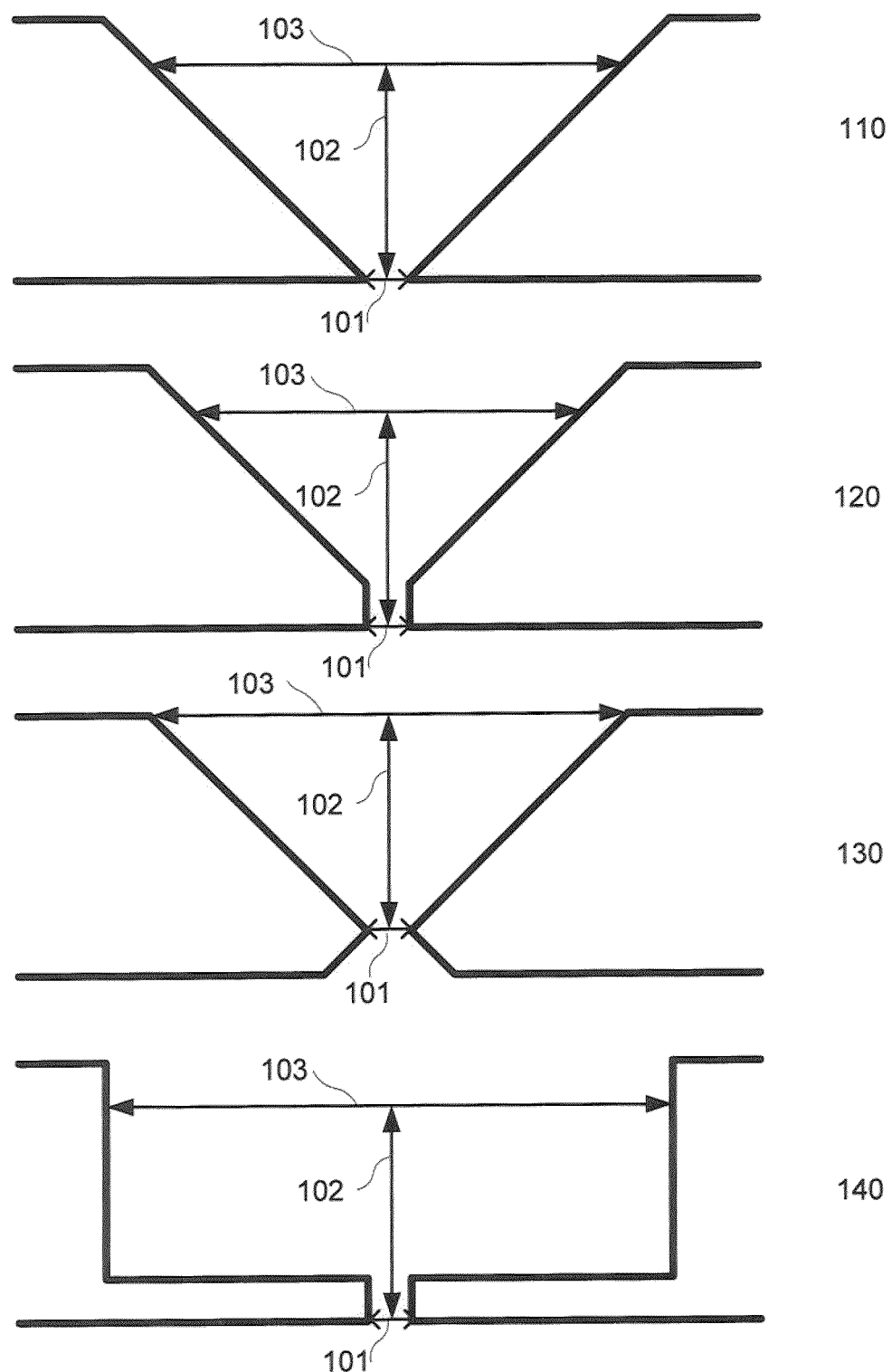
FIG. 1 shows cross sections of four different nozzle geometries.

The pixels of a high definition display may consist of patterned red, green, and blue stripes that are about 30 μm wide. The edges of different color stripes may be separated by only 10 μm. For organic pixels, it is preferred that the pattern have a sharpness of about 5 μm to avoid unintended overlap of materials due to overspray. These dimensions may be useful for other organic devices as well, such as organic transistors or other devices.

One way to deposit organic materials for use in a high definition display, or other device that uses organic materials, is organic vapor jet deposition (OVJP). In order to become a viable display manufacturing technology, it is preferred that organic vapor jet printing be capable of patterning organic films with 5 μm sharpness. It is also preferred that the OVJP process be able to deposit multiple lines simultaneously. Multiple nozzles are one way to achieve the deposition of multiple lines simultaneously.

Modeling of the organic vapor jet printing process for 30 μm scale features using Direct Simulation Monte Carlo (DSMC) techniques has revealed that a nozzle aperture to substrate separation of <5 μm is required to achieve the desired feature sharpness, assuming a nozzle aperture width of 20 μm. This estimate is supported by a rule of thumb observed in previous OVJP studies, that printing resolution scales with nozzle to substrate separation.

However, prior techniques may not be well adapted to producing an array of 20 μm nozzles designed to operate within 5 μm of the substrate. First, a nozzle plate having height tolerances consistent with an optically flat substrate is desirable for operating at these dimensions across a reasonable number of simultaneously deposited lines, to provide the best possible height tolerances. Prior techniques may not have been well adapted to provide such a nozzle plate. For an array of multiple nozzles, flatness is preferably maintained over a relatively large area. Secondly, it is preferred during OVJP to keep the nozzle plate hot, so materials that maintain their strength up to 300° C. are desirable. Additionally, thermal expansion may interfere with maintaining these tight tolerances, so materials that resist thermal expansion or do not result in deformation as a result of thermal expansion are desirable. Finally, the gas dynamics of the nozzle-substrate system indicate that a three dimensional structure is preferred.

Silicon micromachining, or more generally semiconductor micromachining, provides a way to meet these demanding specifications. Fabrication steps can be performed on highly polished wafers, eliminating height variation. The $Si/SiO_2$ system is stable across the applicable range of temperatures for organic vapor deposition. Silicon also has a much lower coefficient of thermal expansion than most metals. Tapered nozzles can be fabricated using anisotropic etchants and multilayer structures can be fabricated using silicon on insulator wafers and wafer bonding techniques. Such techniques have been well developed in the field of microfluidics. Microfluidics is the application of microfabrication techniques to liquid and vapor transport systems and has been used in the field of inkjet printing. Similar techniques may also be applied to metals and ceramics.

Interfacing a microfabricated device with the outside world presents additional issues. In the case of OVJP, the desire to operate at temperatures over 300° C. poses presents even more issues not present in many other fields. An OVJP system may have a user serviceable vapor generation system, which means that an organic material is stored in a structure that is both durable and macroscopic. This, in turn, means that the organic vapor may be transported to the print head using relatively large bore metal tubes. As described herein, using well chosen intermediate materials; it has been demonstrated that a bakeable gas tight seal may be provided between a metal manifold and a silicon nozzle plate.

Some aspects of the invention relate to a nozzle geometry useful for organic vapor jet printing.

In one embodiment, a first device is provided. The device includes a print head. The print head further includes a first nozzle hermetically sealed to a first source of gas. The first nozzle has an aperture having a smallest dimension of 0.5 to 500 microns in a direction perpendicular to a flow direction of the first nozzle. At a distance from the aperture into the first nozzle that is 5 times the smallest dimension of the aperture of the first nozzle, the smallest dimension perpendicular to the flow direction is at least twice the smallest dimension of the aperture of the first nozzle.

FIG. 1 illustrates the dimensions referred to in the previous paragraph, as well as some geometries that meet the criteria. Figures throughout this application are not necessarily drawn to scale. FIG. 1 shows cross sections of four different nozzle geometries, where the cross section is taken in a direction parallel to gas flow in the nozzle, and also in a direction that shows a smallest dimension at the nozzle aperture. In each geometry, an aperture has a smallest dimension 101 in a direction perpendicular to the flow direction of the nozzle. The "aperture" is defined by the point at which this smallest dimension reaches a minimum, i.e, where gas flow through the nozzle is most constricted. Each nozzle also has a distance 102 from the aperture into the nozzle that is 5 times the smallest dimension of the aperture. Each nozzle also has a dimension 103 that is the smallest dimension perpendicular to the flow direction at distance 102 from the aperture into the first nozzle. As illustrated, dimension 103 is at least twice the dimension 101. Nozzle 110 has sloped sides that reach a point at the aperture. Nozzle 120 has sloped sides for a large part of the nozzle, but the sides are vertical for a small distance at the aperture. In this case, where there is a finite distance in the flow direction of the nozzle over which the smallest dimension reaches a minimum, the "aperture" is the point closest to the substrate at which the smallest is at a minimum. Nozzle 120 may have better mechanical strength may be easier to fabricate with a consistent aperture size than nozzle 110. Nozzle 130 has sloped sides that reach a point, but widen out slightly before reaching the bottom of nozzle 130. Nozzle 130 illustrated that the aperture is not necessarily at the point of the nozzle closest to the substrate. Nozzle 140 has vertical sides, with a dramatic narrowing just as the gas flow exits the nozzle. Other nozzle geometries may also meet the criteria of the previous paragraph.

Figure 2:
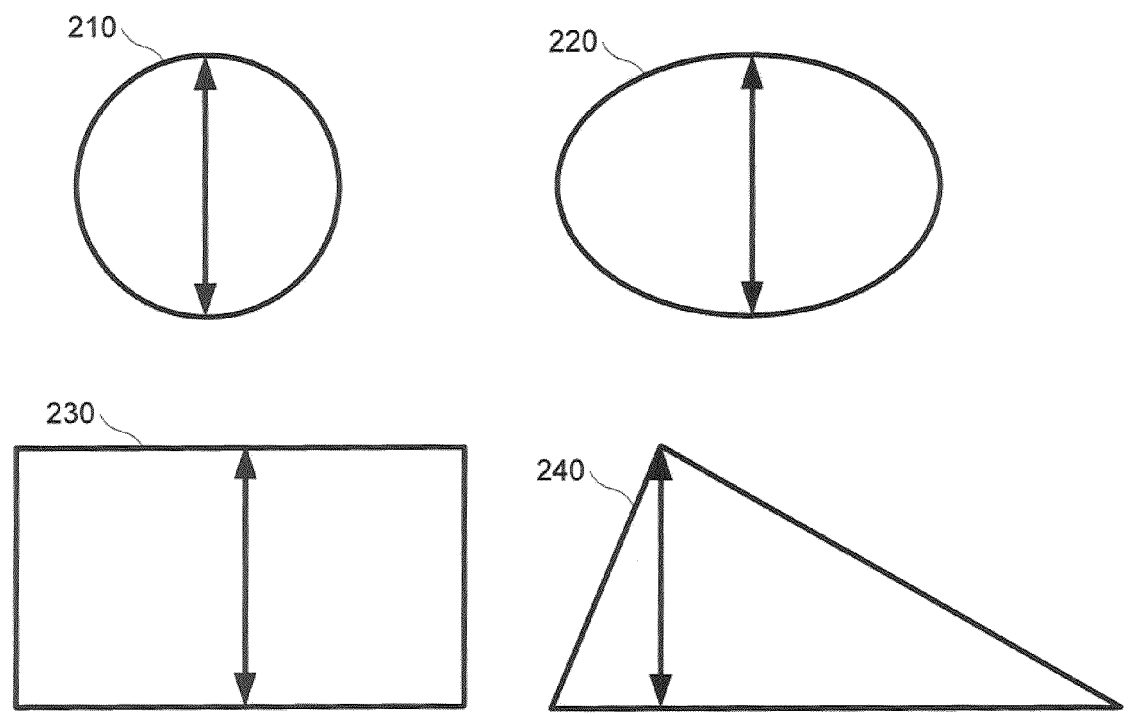
FIG. 2 shows cross sections of four different nozzle geometries taken in a direction perpendicular to gas flow.

FIG. 2 shows cross sections of four different nozzle geometries taken at the aperture in a direction perpendicular to the gas flow. The nozzles for which cross sections are taken in FIG. 2 do not necessarily correspond to those of FIG. 1. The arrow in each aperture represents the "smallest dimension" of the aperture. In mathematical terms, at the smallest dimension, the arrow length is either at a local maximum (for the circle, oval and triangle) or is constant (for the rectangle) with respect to translation of the whole arrow in a direction perpendicular to the arrow, and the "smallest" dimension is the smallest local maximum or constant for which this occurs. FIG. 2 shows cross sections of apertures 210, 220, 230 and 240 having circular, oval, rectangular and triangular cross sections, respectively. A rectangular aperture is the most preferred shape for depositing lines, and is also a relatively easy shape to obtain in a nozzle etched in silicon. However, other shapes may be used.

The print head may include a plurality of first nozzles hermetically sealed to the first source of gas.

The print head may include a second nozzle hermetically sealed to a second source of gas different from the first source of gas. The second nozzle has an aperture having a smallest dimension of 0.5 to 500 microns in a direction perpendicular to a flow direction of the second nozzle. At a distance from the aperture into the second nozzle that is 5 times the smallest dimension of the aperture of the second nozzle, the smallest dimension perpendicular to the flow direction is at least twice the smallest dimension of the aperture of the second nozzle.

The print head may include a third nozzle hermetically sealed to a third source of gas different from the first and second sources of gas. The third nozzle has an aperture having a smallest dimension of 0.5 to 500 microns in a direction perpendicular to a flow direction of the third nozzle. At a distance from the aperture into the third nozzle that is 5 times the smallest dimension of the aperture of the third nozzle, the smallest dimension perpendicular to the flow direction is at least twice the smallest dimension of the aperture of the third nozzle.

The print head may comprise a plurality of first nozzles hermetically sealed to the first source of gas, a plurality of second nozzles hermetically sealed to the second source of gas, and/or a plurality of third nozzles hermetically sealed to the third source of gas.

There are a number of different ways that a nozzle may meet the geometrical considerations discussed above. The first nozzle may have a constant cross section from the aperture to a distance from the aperture into the first nozzle that is 2 times the smallest dimension of the aperture of the first nozzle. The smallest dimension of the first nozzle in a direction perpendicular to a flow direction of the first nozzle may continuously increase with distance from the aperture of the first nozzle for distances in the range of zero to 2 times the smallest dimension of the aperture of the first nozzle. The smallest dimension of the first nozzle in a direction perpendicular to a flow direction of the first nozzle may increase linearly with distance from the aperture of the first nozzle for distances in the range of zero to 2 times the smallest dimension of the aperture of the first nozzle.

The nozzle may be formed from a variety of materials. Silicon is preferred.

Preferred ranges for the smallest dimension of the aperture of the first nozzle in a direction perpendicular to a flow direction of the first nozzle include 100 to 500 microns, 20 to 100 microns, and 0.5 to 20 microns.

Preferred shapes for the cross section of the first nozzle perpendicular to the flow direction of the first nozzle include circular and rectangular.

The first device may be used with multiple gas streams, which may carry different organic materials. The first device preferably includes first and second sources of gas, and a thermal barrier disposed between the print head and the first and second sources of gas. Preferably, independently controllable heat sources are provided for each of the print head, the first source of gas, and the second source of gas.

The first device may be used with gas streams that may carry multiple organic materials in each gas stream, where different organic materials may be sublimated in different chambers having independent temperature control. Preferably, the first source of gas includes a first sublimation chamber and a second sublimation chamber. The first gas source may be separated from the print head by a thermal barrier disposed between the print head and the first source of gas. Independently controllable heat sources may be provided for each of the print head, the first sublimation chamber and the second sublimation chamber. A variety of heat sources may be used. For example, resistive plates on the surface of the print head may be used, or heat sources may be incorporated into the layers of a print head, for example as resistive elements embedded in one or more layers of the print head.

The first device may be used to eject a jet of gas from the first nozzle, as well as the other nozzles.

While the first device is being used to eject jets of gas from the nozzles, different and independently controllable temperatures may be maintained at the print head and the first, second, and/or third sources of gas. In one embodiment, the gas provided by the first source of gas includes a first organic material having a first sublimation temperature, and the gas provided by the second source of gas includes a second organic material having a second sublimation temperature at least 10 degrees Celsius different from the sublimation temperature of the first organic material. The difference in the sublimation temperature is a feature that embodiments of the invention can accommodate much more readily that other designs, but is not needed to take advantage of other aspects of embodiments of the invention. For example, separate sources allow the mix of materials to be continuously varied, whether sublimation temperatures are similar or different.

Some aspects of the invention relate to a microfluidic print head useful for organic vapor jet printing.

The first device may further include a first valve for controlling gas flow to the first organic source and a second valve for controlling gas flow to the second organic source. The first and second valves may be thermally insulated from the heat sources.

The first layer is preferably formed from silicon.

The first layer is preferably bonded to the second layer using a bond selected from the group consisting of a fusion bond, cold weld, an anodic bond, and a eutectic bond. If additional layers are present in the print head, such as a third layer or other layers, they are preferably bonded using these types of bonds. In one embodiment, it is preferred that the first and second layers are bonded to each other using an anodic bond. In another embodiment, it is preferred that a third layer is placed between the first and second layers, the first and third layers are bonded with a eutectic bond or fusion bond, and the third and second layers are bonded, preferably with an anodic bond.

The print head may further include a microelectromechanical switch adapted to block or allow fluid communication between the first via and the at least one of the apertures depending upon the state of the switch.

At least one aperture may be formed in a protrusion from the print head.

The thickness of the print head is preferably between 50 and 500 microns. The thickness of the printhead includes all layers from a first layer that includes the nozzles through and including a second layer that includes vias.

Figure 3:
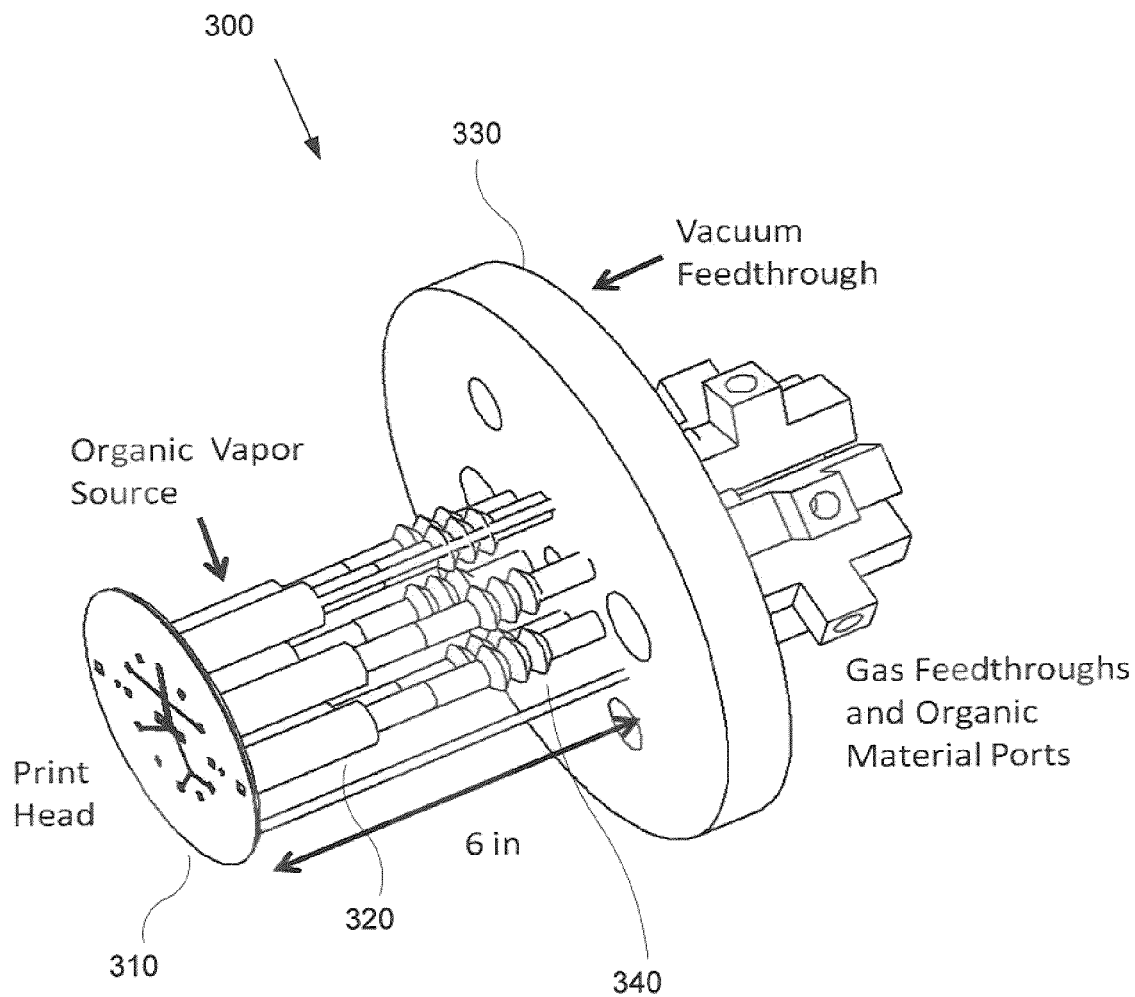
FIG. 3 shows a perspective drawing of an OVJP print head and mounting.

In one embodiment, an organic vapor jet deposition system 300 is provided. FIG. 3 shows a perspective drawing of OVJP system 300, including print head 310 and mounting. System 300 was actually made and operated. System 300 includes a print head 310 containing flow channels and nozzle arrays, which are illustrated in more detail in FIGS. 4 though 6. Six organic vapor sources 320 (also referred to as "gas sources") are welded to a manifold 330 which is then hermetically sealed to the print head. One structure for a vapor source is illustrated in more detail in FIG. 17. Manifold 330 is preferably fabricated from a material that maintains its shape at the print head operating temperatures, such as Kovar controlled expansion steel. Print head 310 may clamped to manifold 330 and sealed using a high temperature perfluroelastomer gasket, to achieve a hermetic seal between the organic vapor sources 320 and print head 310. Other methods of achieving a hermetic seal may also be used, such as anodic bonding of the print head to a Kovar backplate. Organic material is housed within heated tubes that are laser welded to the Kovar manifold, which can be better seen in FIG. 17. Organic vapor sources 320 consist of heated tubes enclosing organic source cells. This assembly is affixed to a 8" in Conflat flange (manifold 330) which serves as both a structural member and a gas feedthrough. The vapor generators are connected to ports on manifold 330 through welded stainless steel bellows 340. Bellows 340 act as expansion joints. Since organic vapor sources 320 may expand when heated, a flexible coupling is desirable between manifold 330 and vapor generators 320 to avoid thermal stress than might be transmitted to and deform print head 310.

Vapor generators 320, bellows 340, manifold 330, and associated fittings form a clear 0.3 in inner diameter conduit stretching from the top of the manifold 330 to print head 310. Organic material is placed in a vented capsule at the end of a glass rod and inserted into the conduit. When a rod is inserted, the organic material it contains is situated inside the heated vapor generator. The top of the conduit is then sealed to the outer diameter of the glass rod using a Swagelok Ultratorr fitting. A thermocouple threaded through inner diameter of the glass rod provides temperature readings inside the vapor generator. Carrier gas is fed into the conduit through a bored through tee adaptors between the feedthrough and the Ultratorr fitting. These features may be seen more clearly in FIG. 17.

Figure 4:
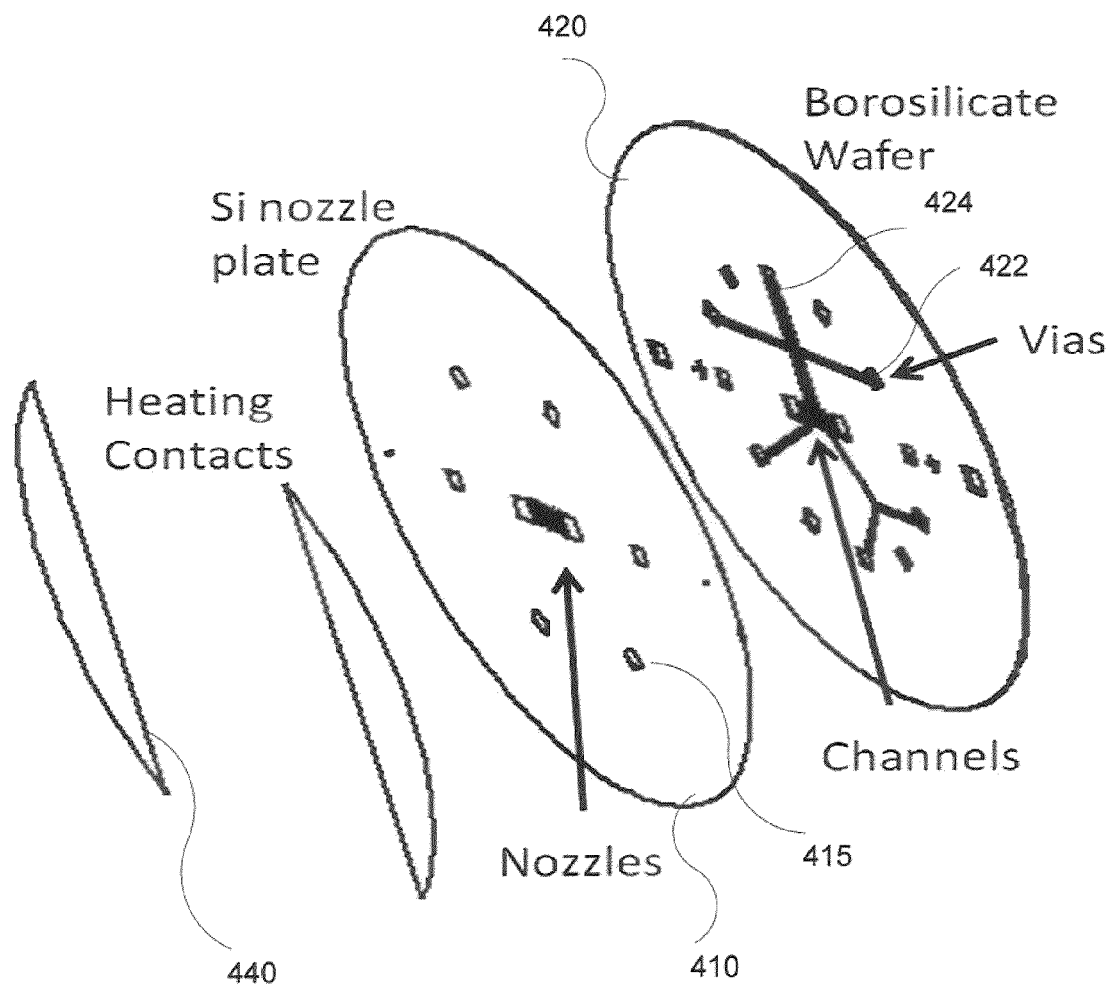
FIG. 4 shows an exploded view of print head.

FIG. 4 shows an exploded view of print head. A first layer 410 of the print head includes a plurality of apertures, which preferably have the dimensions described with respect to FIGS. 1 and 2. First layer 410 is preferably made from silicon, which can be readily patterned to include desired nozzle geometries with known technologies developed, for example, in the context of semiconductor processing. First layer 410 includes a plurality of nozzles 415 patterned therein having apertures. First layer 410 is bonded to second layer 420. Preferred bonding methods include fusion bonding, anodic bonding, cold welding and eutectic bonding. Second layer 420 is preferably made of an insulating material, to limit heat conduction from gas sources and to enable the temperature of first layer 410 to be controlled independently of the temperature of gas sources. Second layer 420 is bonded to first layer 410. Second layer 420 includes vias 422 that are in fluid communication with nozzles 415. As illustrated, channels 424 etched into second layer 420 provide fluid communication between vias 422 and nozzles 415. Ohmic contacts 440 are evaporated over the front of first layer 410 to allow the nozzle plate to be addressed by a heating current.

Figure 5:
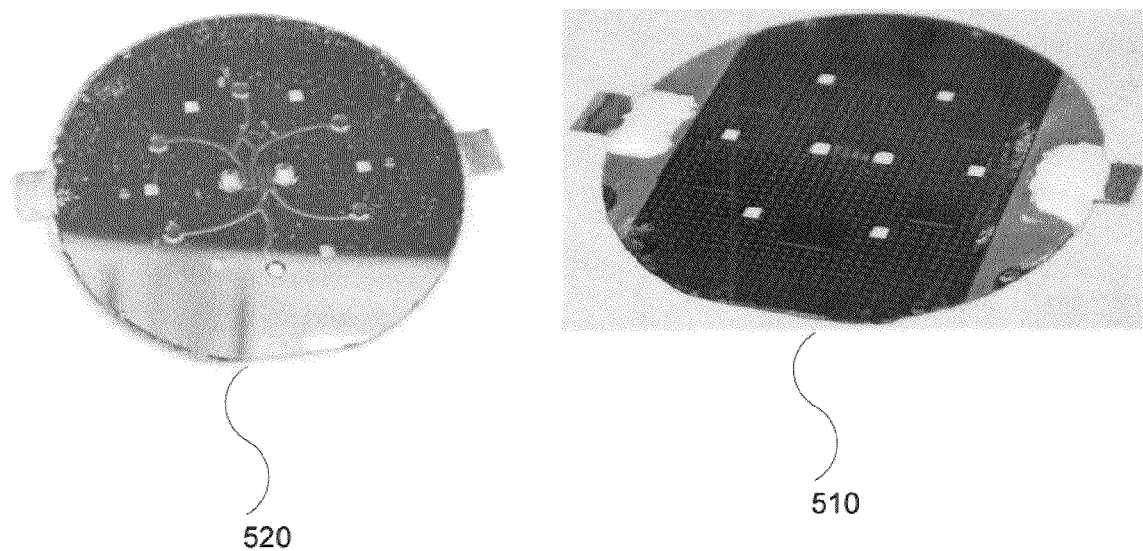
FIG. 5 shows photographs of parts of a print head.

In a print head actually fabricated and used as a part of a deposition system, first layer 410 was a silicon wafer, second layer 420 was a borosilicate wafer, and the two layers were bonded through anodic bonding. FIG. 5 shows photographs of a first layer 510 and a second layer 520 that were actually fabricated.

First layer 410 may include channels that provides fluid communication within the first layer between vias 422 and nozzles 415, instead of or in addition to channels in second layer 420. First layer 410 may further include a heat source, such as heating contacts 440.

A third layer (not shown) may be disposed between the first layer 410 and second layer 420, and bonded to first layer 410 and second layer 420. Preferred bonding methods are as described in the previous paragraph. In this situation, first layer 410 would be considered to be "bonded to" second layer 420. The third layer may include a channel that provides fluid communication between vias 422 and nozzles 415, instead of or in addition to channels in layers 410 and/or 420. The third layer may further include a heat source.

As illustrated in FIG. 4, a plurality of nozzles 415 may be in fluid communication with a single gas source, such as a first gas source. One way to achieve this is to have a channel connect a via to a plurality of nozzles.

Figure 6:
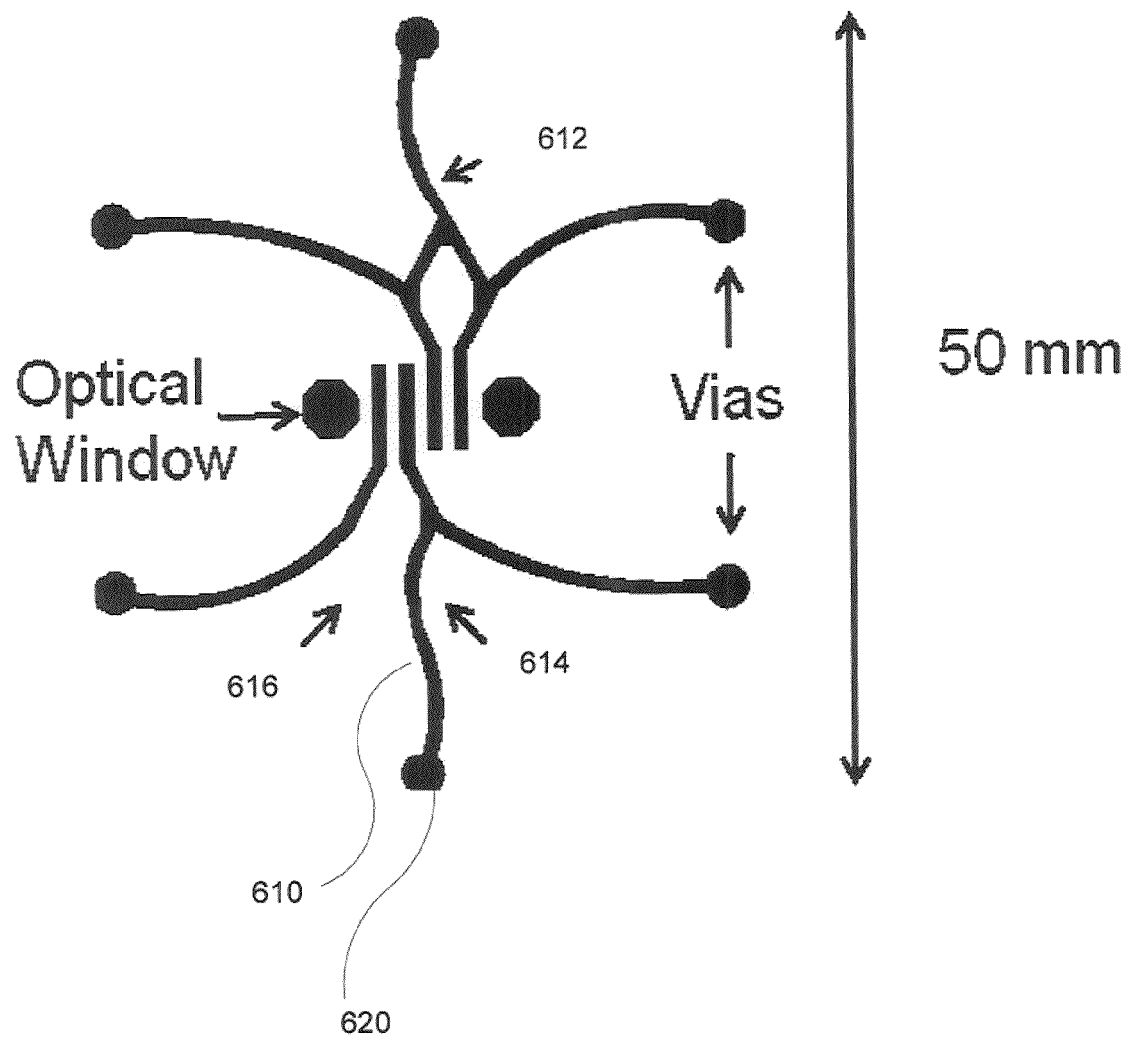
FIG. 6 shows a proof of a mask including channels and vias.

FIG. 6 shows a proof of a mask 600 including channels 610 and vias 620. The structure of FIG. 6 could be applied, for example, to a borosilicate wafer and used as second layer 420 of FIG. 4. Acute angles are avoided to reduce stress. Channels 610 are oriented radially and given gentle curvature to further reduce stress concentrations. Channels 610 form three fluidic circuits. Circuit 612 allow two different dopants in a common host to be fed into separate nozzle array. Circuit 614 allows host and dopant materials to mix before being ejected from a nozzle array. Circuit 616 feeds material from a single source to a nozzle array.

As can be seen from FIG. 4, multiple gas sources may be hermetically sealed to a print head. As can be seen from FIG. 6, channels can be used to route gas from multiple sources in a wide variety of ways. For example, first and second, or first second and third gas sources, hermetically sealed to a print head, may each be in fluid communication with their own separate nozzle arrays. This would occur, for example, if the structure of FIG. 6 were adjusted to include three circuits similar to circuit 616. In this situation, the first device may further include a second gas source hermetically sealed to the print head. The first via of the second layer may be in fluid communication with a first group of apertures of the first layer. The second layer may further include a second via in fluid communication with the second gas source and a second group of apertures of the first layer. The first device may further include a third gas source hermetically sealed to the print head. The second layer may further include a third via in fluid communication with the third gas source and a third group of apertures of the first layer.

Multiple vias connected to different gas sources may be in fluid communication with the same aperture, resulting in a mix of gases at the aperture. One, two, three, or more gases from different sources may be mixed in this way, as illustrated by circuits 612, 614 and 616. For example, the first via may be in fluid communication with a first organic source, while a second via is in fluid communication with a second organic source. The first and second vias may both in fluid communication with a first group of apertures of the first layer. The print head, the first organic source and the second organic source each have independently controllable heat sources.

In addition to mixing gases from different sources in circuits in the print head, a gas source, such as the first gas source or any other gas source, may include multiple organic materials either from the same evaporation chamber or different evaporation chambers. However, mixing in the print head allows for maximum flexibility in terms of separately controlling parameters such as temperature and gas flow in each chamber where organic material is sublimated. This may be highly desirable, for example, where two organic materials have significantly different sublimation temperatures. Rates of sublimation can be more readily controlled. In addition, where sublimation temperatures are dramatically different, a temperature desirable to sublimate one material may be detrimental to a different material.

Figure 7:
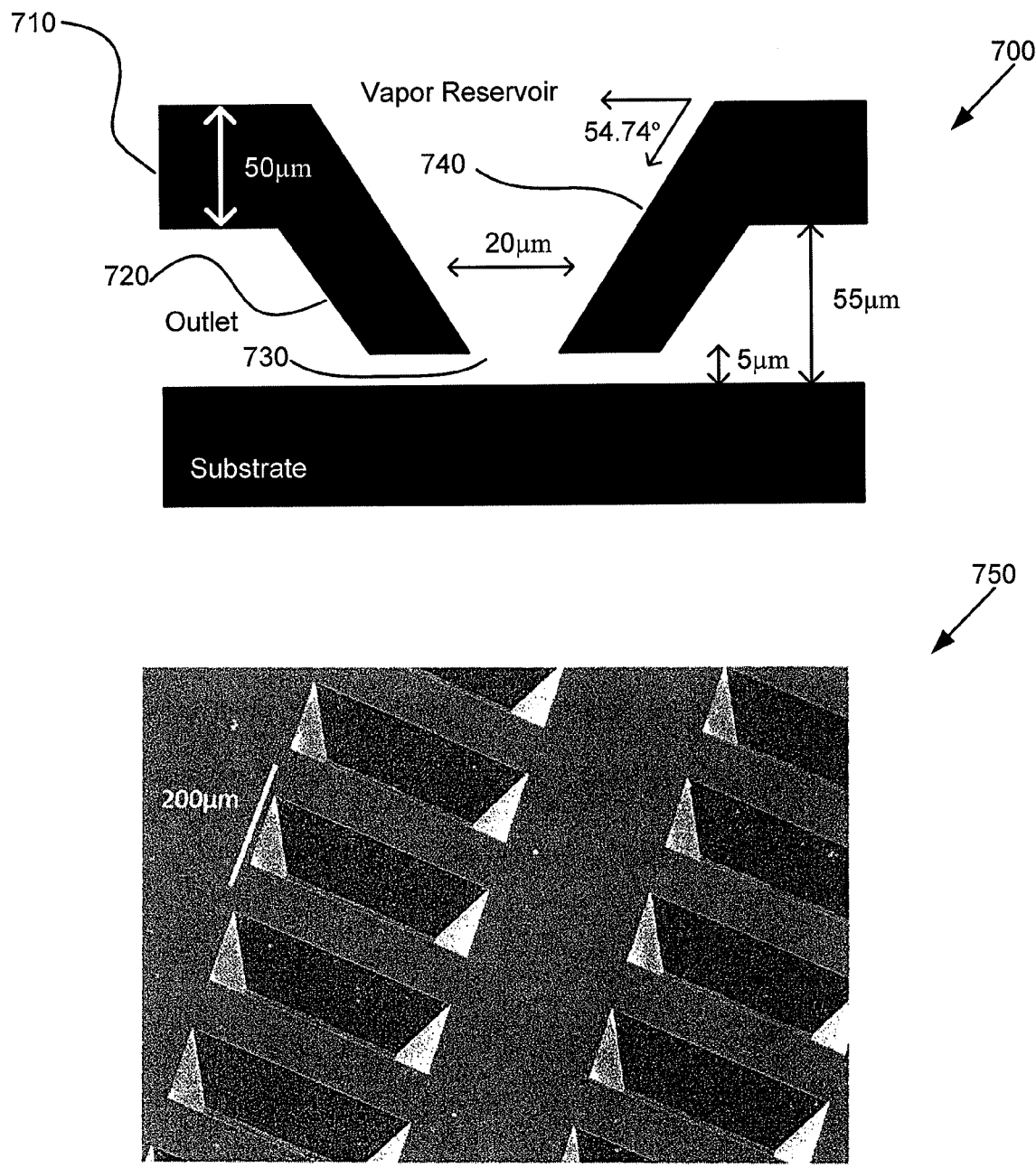
FIG. 7 shows a cross-section of a rectangular nozzle that was actually fabricated, as well as a scanning electron microscope photograph of the nozzle inlets etched into Si.

FIG. 7 shows a cross-section 700 of a rectangular nozzle 740 that was actually fabricated. Nozzle 740 was fabricated in a first layer 710 that was made of silicon. The silicon wafer used to create first layer 710 started out thicker than 50 microns to allow for protrusions, but had a final thickness of 50 microns. Nozzle 740 has an aperture 730 that is located in a protrusion 720 from first layer 710. Aperture 730 has a smallest dimension of 20 microns. Protrusion 720 protrudes 50 microns from first layer 710. It is intended that nozzle 740 be used in close proximity to a substrate, such that the nozzle-substrate separation distance is about 5 microns. Protrusion 720 allows for gas expelled from the nozzle to escape without needing to travel through a 5 micron thick space all the way to the edge of first layer 710. The angle between the nozzle wall and the plane of first layer 710 is 54.74 degrees, which is readily achieved using known silicon etching technology involving selective etching of the <100> plane of Si by KOH. FIG. 7 also shows image 750, showing nozzle inlets etched into Si viewed under a scanning electron microscope.

Figure 8:
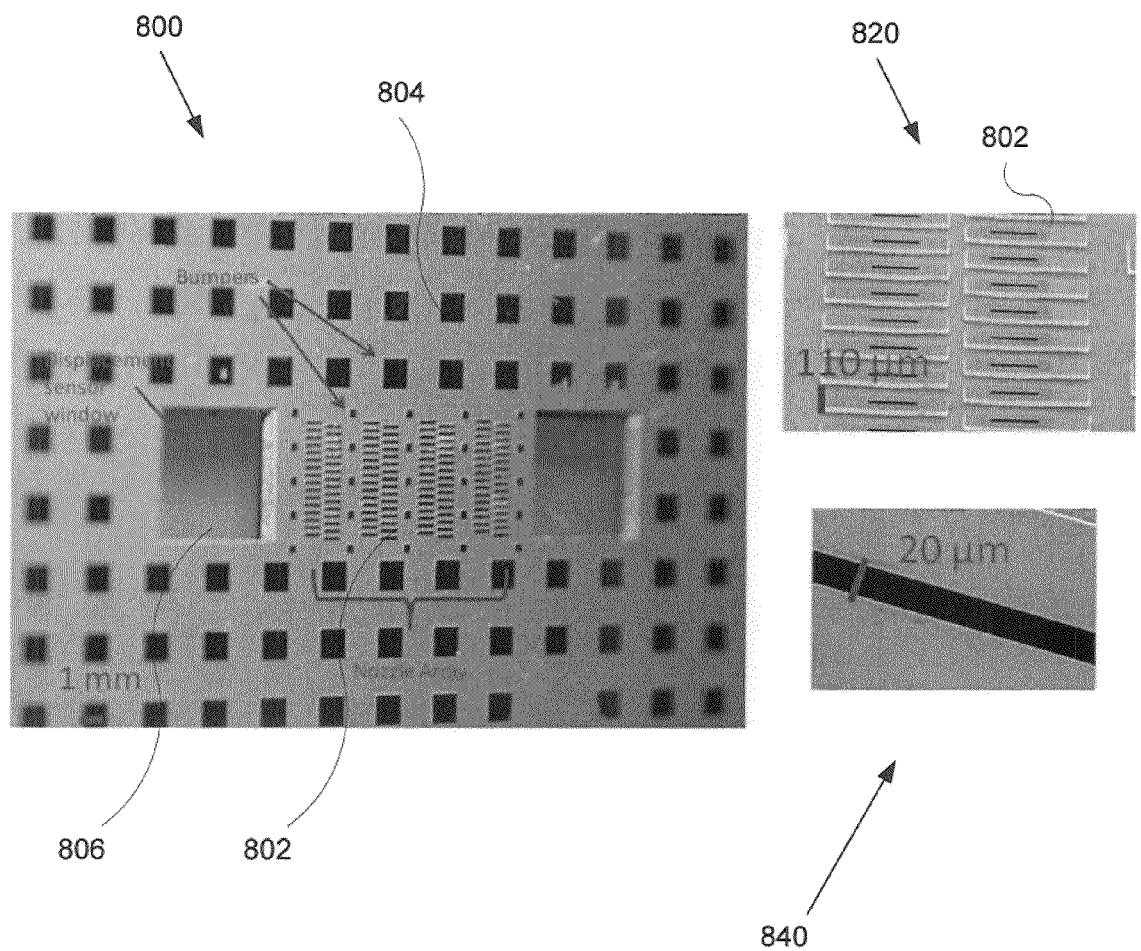
FIG. 8 shows a photograph of nozzle side of completed print head, as well as a scanning electron micrograph (SEM) of a portion of the nozzle array 802 and a SEM of a nozzle aperture.

FIG. 8 shows a photograph 800 of nozzle side of completed print head. Nozzle array 802 is the array of high aspect-ratio rectangles in the center of the photograph. Bumpers 804 appear as dark squares. Larger bumpers are located farther away from nozzle array, while smaller bumpers are located near and interspersed with nozzle array 802. Bumpers 804 are helpful in maintaining a desired substrate-nozzle separation during deposition. Bumpers 804 are useful in a laboratory context, but may or may not be present in a commercial embodiment. A displacement sensor window 806 is also shown. Displacement sensor window 806 provides a way to see the substrate when the nozzle is in use, and, for example, to measure substrate/nozzle separation, or to position the nozzles based on alignment marks or other features on a substrate. FIG. 8 also shows a scanning electron micrograph (SEM) 820 of a portion of nozzle array 802. FIG. 8 also shows a SEM of a nozzle aperture of nozzle array 802.

The structure illustrated and photographed in FIGS. 5 through 8 was actually fabricated. The print head is composed of two bonded wafers (first and second layers). The bottom most wafer is the nozzle plate, which was 100 μM thick silicon, which is shown in FIGS. 7 and 8. A total of 128 nozzles are etched into the plate. The nozzles have a bottom aperture of dimensions 20 μm by 200 μm with the long axis corresponding to the direction of substrate travel so as to produce narrow lines. The smallest dimension of these apertures is 20 μm. The nozzles are arranged in four banks of 32 each and some of the banks are offset relative to each other to allow printing of multiple side by side stripes. Each of the banks can deposit different organic vapor formulations simultaneously. Anisotropic etching produces a nozzle inlet much wider than the outlet. The underside of the print head, the side facing the substrate, is etched back so that the nozzle tips and other features are elevated beyond the wafer surface. Elevated nozzle tips allow the nozzles to be brought close to the substrate while still allowing carrier gas to easily escape in the gap between the print head and substrate. A network of raised bumpers around the nozzles protects the nozzle tips from against crashing into the substrate. The nozzle plate is ported with optical windows to allow for the incorporation of an optical displacement sensor to measure position relative to the substrate.

The channel and insulator layer (the second layer), which is shown in FIGS. 5 and 6, is made of 500 μm thick borosilicate glass. The nozzles are fed by 100-200 μm deep fluidic channels etched into the side of the glass wafer facing the nozzle plate. These channels are fed through vias which extend through the thickness of the wafer. When the channel layer and insulator layer are bonded, a set of three fluidic independent fluidic circuits is formed. Vapor can be fed through any of the six vias and will emerge from the nozzles as dictated by the circuit layout.

The print head illustrated in FIGS. 5 through 8 was incorporated into a organic vapor jet printing system 300 as illustrated in FIG. 3. As described with respect to FIG. 3, the print head rests on a Kovar manifold. It is sealed to the manifold with a custom cut rubber gasket and held in place with stainless steel and Inconel clamps. High temperature rubbers such as Kalrez can be used for the gasket. Other packaging strategies, such as anodic bonding the print head to a Kovar backplane, may be used. It is believed that a metal backplane will provide a more robust scaling surface for the print head.

Effects of the nozzle and print head to substrate gap can be modeled mathematically. The flow of carrier gas through the print head to substrate gap can be modeled using the lubrication approximation for incompressible viscous flows. All non-radial components of flow are ignored. The characteristic length defining flow is the print head to substrate gap, h. Pressure variation over this length is negligible, and gas expansion over the radial dimension can be approximated using the ideal gas law. The average velocity of vapor flow is given by eq II.A.1. μ is viscosity, P is pressure, T is temperature, R is the ideal gas constant, r is radius, and J is molar flow rate.

$$\langle v \rangle = \frac{-h^2}{12\mu} \frac{dP}{dr} = \frac{J}{2\pi hr} \frac{RT}{P} \qquad \text{Eq. II.A.1}$$

This can be expressed as differential equation Eq. II.A.2 and solved. i and o subscripts denote input and output conditions.

$$\frac{dP^2}{dr} = -\frac{12J\mu RT}{\pi rh^3} \qquad \text{Eq. II.A.2}$$

$$P_i^2 - P_o^2 = \frac{12J\mu RT}{\pi h^3} \ln\left(\frac{r_o}{r_i}\right)$$

Assuming an outer radius of 50 mm, and inner radius of 10 mm, carrier gas viscosity of 2.5×10$^{-5}$ kg/m*s, a molar flow rate equivalent to 2 sccm, and negligible pressure at the outer edge of print head, the pressure on the inside of the disc is roughly 3500 Pa.

Intuitively, the largest pressure drop will occur between in the gap between the lower tip of the nozzle and the substrate. Assuming the downstream end of this gap is at 3,500 Pa, gas molecules inside will have a mean free path of 3.5 μm. Particle to wall collisions will likely dominate in this regime, so it can be treated as a Knudsen flow. Using the transition probability method of Clausing, P J. Vac. Tech 8 636-46, the rate of molecular flow between two regions is given by eq. II.A.3, where J is rate of molecular flow, T and P are temperature and pressure, m is the molecular mass of the carrier gas, A is the area of the tube, and w is a transmission probability. Stanteler D. J. and D. Boeckman J. Vac Sci Tech. A 9 (4) 8 July/August 1991 calculated w=0.533 for a wide rectangular conduit with a length to height ratio of 4:1.

$$J = \frac{Aw}{4} \sqrt{\frac{8}{\pi m k_B T}} (P_1 - P_2) = 0.0023 \frac{sccm}{Pa} \Delta P \qquad \text{Eq. II.A.3}$$

for gaps in parallel

Figure 9:
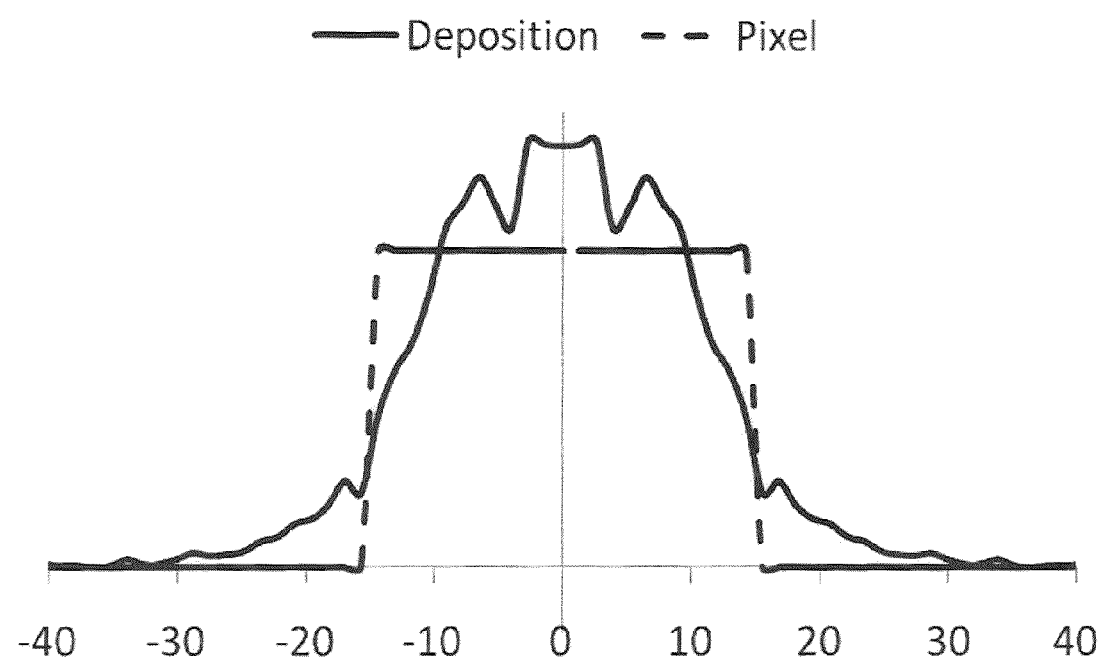
FIG. 9 shows a modeled deposition profile.

A survey of possible nozzle designs by Direct Simulation Monte Carlo techniques suggests that a nozzle design with an inner and outer taper produces the optimal flow pattern for high resolution deposition. The fluidic resistance is in good agreement with the above analytical model, predicting a conductance of 0.0021 sccm/Pa. A rectangular nozzle tip of cross section 20 µm by 200 µm m is recommended. The recommended nozzle to substrate separation is 3 to 5 µm. 32 such nozzles or more can be situated in an array. A large array of nozzles is beneficial, since it reduces the pressure differential between the vapor generators and substrate. The resulting deposition profile is expected to have a full width at half maximum of 18 µm. Deposition is expected to drop off to 10% of its centerline value in 40 µm, making it capable of accurately depositing within a 30 µm pixel bordered by 30 µm without significantly intruding on neighboring pixels. The expected deposition profile is shown in FIG. 9 as a solid line, for a double tapered nozzle with 20 µm wide aperture and 5 µm tip to substrate gap. Height is in arbitrary units. An ideal pixel filling deposition profile with height equal to profile average over pixel width is shown in dashes.

Figure 10:
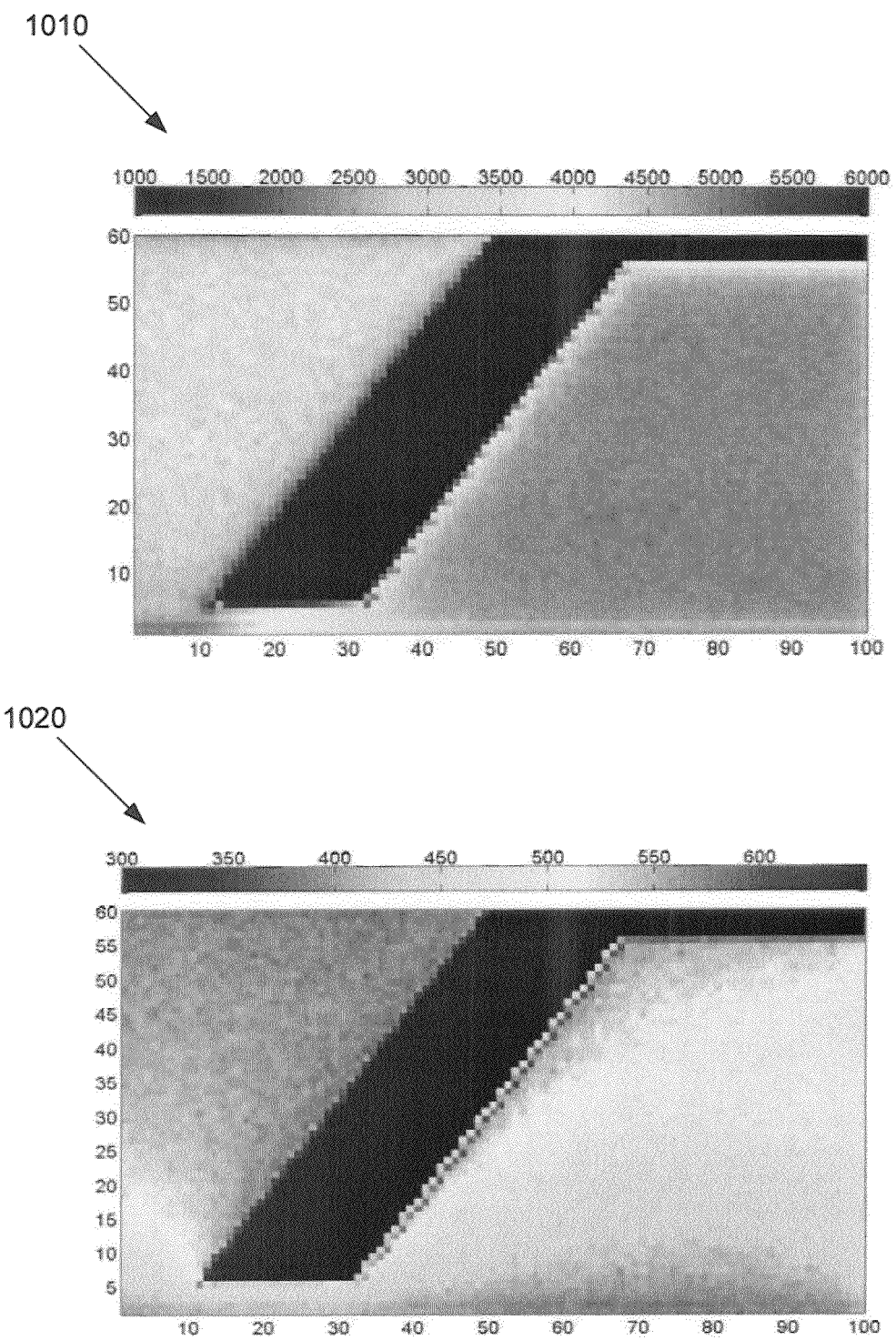
FIG. 10 shows modeled pressure and temperature profiles.

FIG. 10 shows a modeled pressure profile 1010 and a modeled temperature profile 1020 for a double tapered nozzle with 20 µm wide aperture and 5 µm tip to substrate gap. The barrier created by the nozzle body is the dark region in cross section. The profiles are symmetric, so showing only half of the nozzle captures the relevant information.

Satisfactory deposition profiles can be achieved without an outer taper on the nozzle to match the inner taper of the nozzle, however this is less preferred because the conductivity of the simulated nozzle structure drops by a factor of five. The effect becomes more pronounced once the reduced exit path of gas from the nozzle to the print head edge is considered. The pressure required to yield a desired flow rate dilutes the organic in the vapor stream and enhances heat transfer between the print head and substrate. This leads to a non-ideal operating regime. However, print heads without the underside taper have proven to be effective deposition tools, and may be used because they are easier to fabricate than a print head having a tapered underside.

Operating pressure increases, although not as severely, if the inner taper is deleted. Interestingly, however, the deposition profile takes on a double peaked structure, shown in FIG. 9. It is possible that the inner taper can be optomized to produce an optomized, mesa-like deposition profile. Plasma etching can be used to fabricate a wide range of geometries.

Flow through vapor generators and channel array also be mathematically modeled. Volume flow rate for a rectangular conduit with short cross sectional dimension h and larger cross section dimension w is calculated using, eq II.B.I dervied from the incompressible Navier-Stokes equations. It is then converted to a molar flow rate using the ideal gas law. µ is viscosity and x is the axial dimension of the channel and positive in the downstream direction. P. T are pressure and temperature in the channel. R is the ideal gas constant.

$$Q_{vol} = -\frac{dP}{dx}\frac{h^3 w}{12\mu} \qquad \text{eq. II.B.1}$$

$$Q_{=mol} = -\frac{P}{RT}\frac{dP}{dx}\frac{h^3 w}{12\mu} = -\frac{dP^2}{dx}\frac{h^3 w}{24\mu}$$

Figure 11:
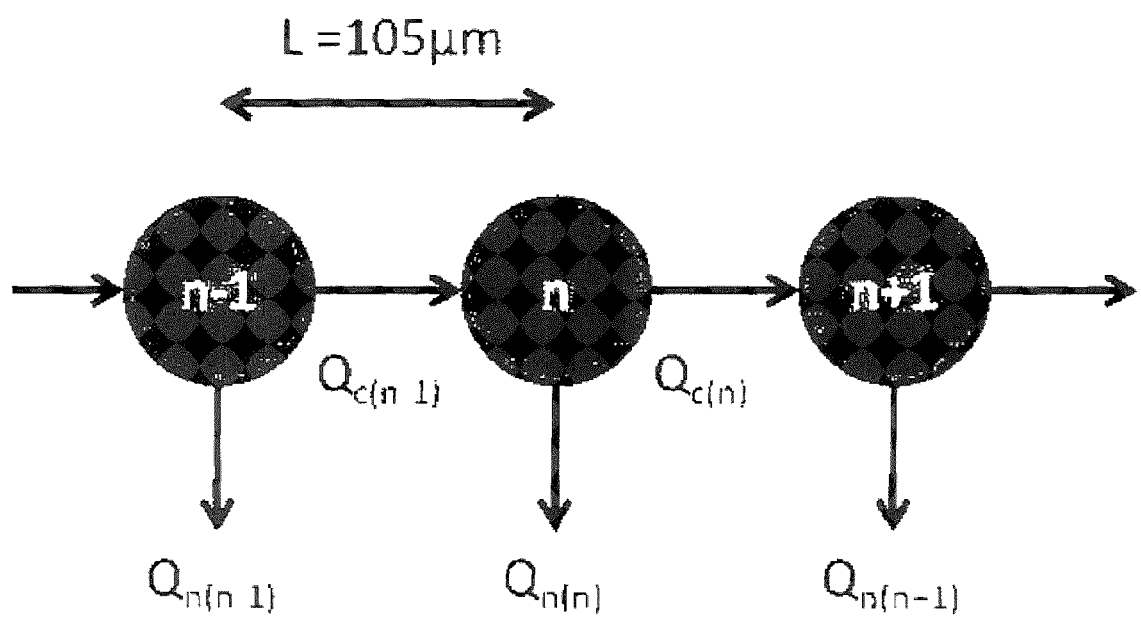
FIG. 11 shows a model used in a circuit analysis of a nozzle array. Fluidic resistances were estimated and even distribution of vapor to all nozzles in the array was verified.

The nozzle array can be analyzed by breaking it up into segments and applying reasoning similar to Kirchoff's current law. A laminar compressible flow through a nozzle generally scales as $Q_{mol} \sim P^2$. However, due to the very small length scale, through the nozzles themselves scales linearly with P. A loss factor of C=5.4×10$^{-11}$ mol/(Pa*s) for nozzles of the geometry proscribed in sec I.B.2 was estimated using a Direct Simulation Monte Carlo Code. FIG. 11 shows a model used in a circuit analysis of a nozzle array. Fluidic resistances were estimated and even distribution of vapor to all nozzles in the array was verified.

$$Q_{c(n)} = Q_{c(n-1)} - Q_{n(n)} \qquad \text{eq II.B.2}$$

$$Q_{c(n)} = \frac{P_{n-1}^2 - P_n^2}{L}\frac{h^3 w}{24\mu RT} \qquad \text{eq II.B.3}$$

$$Q_{n(n)} = Cf(P_n, P_T)_{10} \qquad \text{eq II.B.4}$$

After 32 segments, a pressure change of less than 0.2% is expected. Pressure driving flow through the nozzles is expected to be constant along the array.

Rate of vapor generation can be approximated by eq II.B.5, where P is the pressure of the vapor generation cell, P* is the equilibrium vapor pressure of the organic material in the cell, q is the flow rate of carrier gas, and quantity of organic material leaving the cell. γ is a efficiency parameter indicating the degree of saturation of the vapor effluent from the generator. This is close to unity for a well designed system. The vapor pressure of OLED materials can be estimated from previous OVJP work. A previous system used 5 sccm of carrier gas at 8 Torr to sweep saturated CBP vapor out of source cells towards the nozzle. The instrument was capable of a 2000 Å/s deposition rate, which suggests a vapor generation rate of roughly 2×10$^{14}$ molecule/s and a CBP vapor pressure of 800 µTorr.

$$j = \gamma\frac{P*}{P}q \qquad \text{eq. II.B.5}$$

Assuming a 4 sccm flow of carrier gas through the CBP vapor generator at an operating pressure of 40 Torr, roughly 3.3×10$^{13}$ molecule/s will be produced. This translates to a deposition rate of 900 Å/s under the nozzle apertures. This, in turn predicts a write speed of 0.6 mm/s. Carrier gas flow rates have been significantly reduced from these estimated conditions, with flows of 1 sccm and pressures below 10 Torr being typical. Despite this change, comparable write speeds of approximately 1 mm/s have been observed.

Modeling of organic boats in the vapor generator assume organic is stored in a vented capsule, and is convected away by carrier gas moving over the vent. In this situation, the organic vapor and carrier gas mixture leaves the vapor generator in a 95% saturated condition. It is expected that separate dilution flows of carrier gas are not necessary to advance organic material downstream. Furthermore, organic vapor is already very dilute in terms of mole fraction (~0.004%). Further dilution may merely increase pressure drop and not improve performance.

If flow through the organic vapor source cells is allowed to stagnate, organic material can backstream by migrating upstream to cooler regions of the tube enclosing the source cell. Assuming the organic vapor source cell is maintained at 4 sccm, 40 Torr, and 300° C., a 5 cm heated zone is sufficient to prevent backstreaming of organic material according to modeling in COMSOL. Operating conditions may vary significantly from these initial predicted conditions, however no serious backstreaming of organic material has been observed.

A thermal analysis may also be performed to model temperature throughout an organic vapor jet deposition system.

The temperature of the print head may be modeled. Uniform heating can be achieved by applying an Ohmic heating current directly through the print head using large area contacts. If necessary, the conductivity of the print head can be supplemented by an additional thin layer of Ti or Ni applied to its underside. Si s a good conductor of heat, and the borosilicate layer helps to reduce heat transfer to the metal backplane. Experience has shown that, for the geometries actually fabricated, the print head requires approximately 40 to 60 W of heating to reach operating an operating temperature of 300° C. when in close proximity' to a chilled substrate. Direct measurement of print head temperatures at multiple points has not yet been feasible, but lower power measurements in air suggest that temperature is uniform across the print head. Heating current for the print head is driven by an isolated DC power supply with continuously variable output. This has proven desirable to eliminate both the time domain thermal stress caused by on/off control, and the risk of arcing from a non-isolated power supply.

To good approximation, modeling with Comsol indicates that temperature is also expected to uniform along cross sections in the region subtended by the channel.

Figure 12:
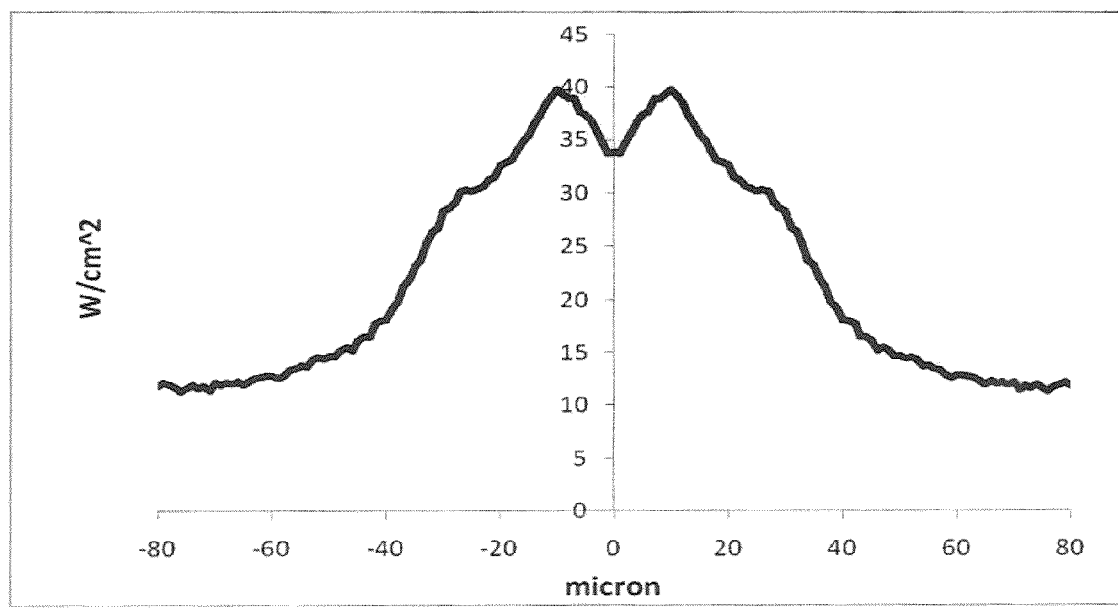
FIG. 12 shows a modeled heat transfer profile in the vicinity of a 20 mm wide nozzle.

The temperature of the substrate may also be modeled. Previous unpublished studies in the inventor's laboratories of OLED growth on a temperature controlled substrate chuck has shown that films can be grown at temperatures of approximately 360K without serious loss of performance in the resulting devices. This can be taken as an approximate maximum desirable temperature specification for the substrate surface. The heat transfer profile on a substrate in the vicinity of a 20 mm wide nozzle is shown in FIG. 12, based on modeling. The nozzle used for the calculation was a double tapered nozzle with 20 μm wide aperture and 5 μm tip to substrate gap. Distances are from nozzle centerline. The model results are in good agreement with analytical estimates.

As can be seen in FIG. 12, the nozzles themselves produce hot sports with 40 W/cm² of heat flux. This compares with an average heat flux of 15 W/cm². Since these hot spots are relatively small, there is only a modest increase in temperature compared to the surrounding substrate, which acts as a heat sink. Modeling in COMSOL predicts a steady state temperature increase of only about 20K in a hot spot. While such individual hot spots are easy to manage, the overall heat load from many such hot spots is high. Liquid nitrogen cooling may be preferred to drive sufficient heat transfer through a glass substrate to keep the surface of the substrate below 360K. To this end, the OVJP system has been equipped with a $LN_2$ feed system that is capable of chilling the substrate holder to 150K and below. Depositing organic material at the low substrate temperatures achieved with this arrangement has the further advantage of reducing material migration and improving the sharpness of features.

Heat transfer in vapor generators may also be modeled. The heat transfer modeling of the vapor generators has both a solid and fluid component. Carrier gas is preferably rapidly heated to the organic sublimation temperature before it comes into contact with the organic source boat at the base of the generator. Modeling with Comsol indicates that that this happens extremely quickly, due to the combination of short characteristic length and the relatively high thermal conductivity of gases at reduced pressure. Assuming a sharp transition in wall temperature between the ambient and heated regions of the source cell, a transition length of only 4 mm is required to heat the gas.

The solid component of the heat transfer problem involves quantifying how sharp this transition is. The source cell tube can be modeled as a one dimensional problem. Since the tube is thin walled, radial temperature gradients are minimal. The contents of the tube are further assumed to have minimal thermal mass, an assumption supported by the short thermal transition length of the carrier gas. The heat equation for these assumptions and accounting for blackbody radiation is given by eq. II.C.1

$$k\tau \frac{d^2 T}{dx^2} = \sigma(T^4 - T_c^4) + h(T - T_c) \quad \text{eq. II.C.1}$$

where k is the thermal conductivity of the metal tube, T is the tube thickness, and $T_c$ is the chamber temperature.

Assuming a chamber background pressure of 30 mTorr, the source cell will have a heat transfer coefficient with the residual chamber gas of h=5.4 W/m²K. After linearizing the blackbody radiation term, eq. II.C.1 can be transformed into equation, eq. II.C.2. The characteristic length of this equation is 2 cm, and gives a rough estimate of the length of temperature gradient in the vapor generator tube between the heated and unheated regions. Therefore, a minimal length of heated tubing is required to warm the gas before it flows past an organic vapor source.

$$\frac{d^2 T}{dx^2} = \left(48\frac{1}{m}\right)^2 (T - T_c) \quad \text{eq. II.C.2}$$

Mechanical Deformation of a print head can also be modeled. Two possible causes of print head deformation have been identified. Thermally induced stress from uneven heating and differences in thermal expansion may cause the print head to warp. A relatively large pressure differential may exist across the portion of the nozzle plate forming the base of the channel. Properly estimating the lengths of these deformations and designing to minimize them is desirable to obtaining a print head that remains flat during printing, which is in turn desirable for accurate printing.

It is believed that, by far, the most significant deformations are created by thermal stresses in the print head wafer stack. Vertical deflection due to thermal stress was modeled using the MEMS thermal-structural interaction package in COMSOL. The wafer stack was modeled in cylindrical coordinates. Assuming perfect flatness at room temperature, once the thin film heater is activated, the wafer stack is calculated to bow downwards so that the center of the plate is 20 μm lower than the outer rim. Measurements of a print head prototype on a nexus thin film stress measuring apparatus reveal warping such that the center of the wafer is 10 μm higher than the outer rim.

Figure 13:
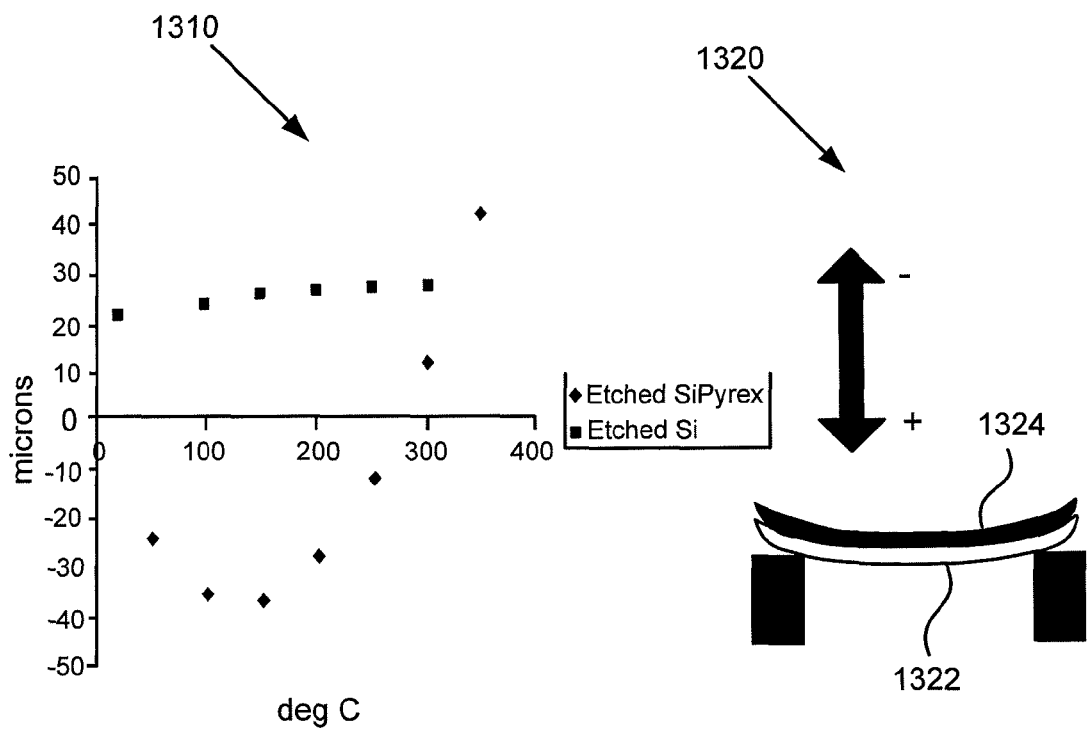
FIG. 13 shows a plot of the height of the center of a wafer relative to outer rim as function of temperature, as well as a schematic of the setup used to obtain the data.

FIG. 13 shows a plot 1310 of the height of the center of a wafer relative to outer rim as function of temperature, as well as a schematic 1320 of the setup used to obtain the data. Data for a single wafer is shown as squares, and data for a print head stack is shown as diamonds. Schematic 1320 shows a borosilicate layer 1324 is and a Si layer 1322. Although a displacement on the order of 10 μm is significant with respect to nozzle spacing, the flatness over the nozzle array itself is expected to be about 2 μm. The lower number is because the nozzles are relatively close together near the center of the substrate, and move as a group when the wafer deforms. Since the nozzle array will curve downward, the plate will not obstruct nozzle positioning, and the nozzles can be brought arbitrarily close. The nozzles themselves may be placed dead center to minimize substrate curvature. A non contact height sensor can measure the relative distance between the nozzle tips and substrate at operating temperature once properly calibrated. Thermal warping is expected to be the largest source of error, but a source of error that can be held at manageable levels.

For the system shown in FIG. 3, the vapor generators themselves are expected to lengthen by up to 200 μm in response to heating. To prevent this from distorting the print head, the vapor generators may be connected to the flange by bellows as illustrated in FIG. 3. This prevents the flange from pushing against the print head.

The effect of pressure differentials on wafer deformation was also considered. The maximum bending of a membrane in short axis cross section in response to an evenly distributed load is given by eq. II.D.2, which is based on Moore, J. H., Davis, C. C., and M. A. Coplan *Building Scientific Apparatus* Westview Press; 3rd edition (2002). This is also a result of the biharmonic stress equation. As before, w is the vertical displacement, P is pressure load, and F is the Young's modulus, and t is plate thickness. L is the width of the plate. A 50 μm thick Si membrane 1 mm wide is expected to bow out by 40 nm in response to a worst case cross membrane pressure differential of 10,000 Pa. This is also not a significant deformation, however the inverse cube dependence of deformation on membrane thickness means that the membrane becomes much more deformable for a thinner rigid nozzle plate. But it is expected that these deformations will also be manageable.

$$w = \frac{PL^4}{32Ft^3} \qquad \text{eq. II.D.2}$$

As mentioned above, one way to address print head deformation is to measure the position of the nozzles, since deformation across a relatively small nozzle array may be small, even where there is larger deformation across the rest of the print head. To this end, a Philtech RZ-25 demonstrator model was obtained and tested against an ITO glass target. The sensor consists of a bundle of optical fibers. Some fibers emit light and others receive light. The degree of coupling between emitting and receiving fibers is determined by the distance between the bundle and a reflective target. The RZ series sensors feature two separate bundles that operate in parallel to correct for differences in target reflectivity.

Figure 14:
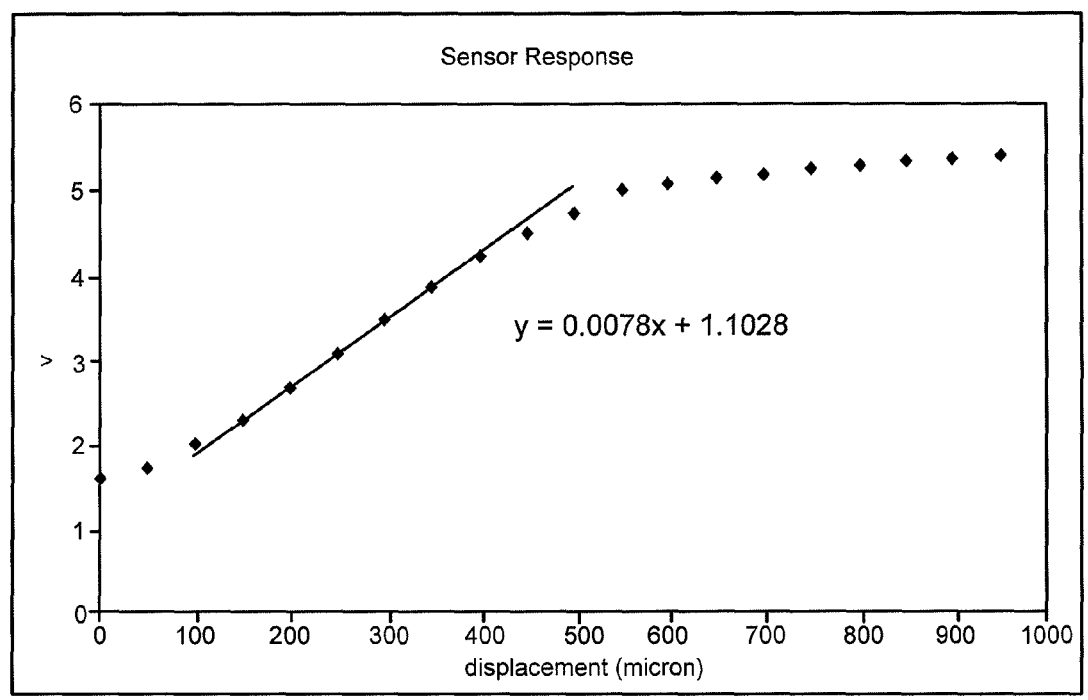
FIG. 14 shows a plot of displacement vs. voltage for calibration of a PhilTech RZ-25 displacement sensor on an ITO target.

The signal was stable to 1 mV, and given a linear response of 0.008V/μm, a precision of 250 nm is can be obtained. The advertised precision is 200 nm. The linear range of the sensor is apparently limited by the transparency of the ITO, and the strength of the reflection from the far surface. The sensor does not work properly if the ITO target sits on a reflective surface. The linear range extends for roughly 300 μm if the ITO target is mounted on a matte black surface. This is approximately half of the advertised value. The full linear range can be obtained when measuring from an opaque target. Other measurement techniques may be used to compensate for these issues. Although the range of the sensor is limited, 300 μm is more than adequate for fine control of stage elevation. A non-reflective substrate holder is preferred. FIG. 14 shows a plot of displacement vs. voltage for calibration of a PhilTech RZ-25 displacement sensor on an ITO target.

Figure 15:
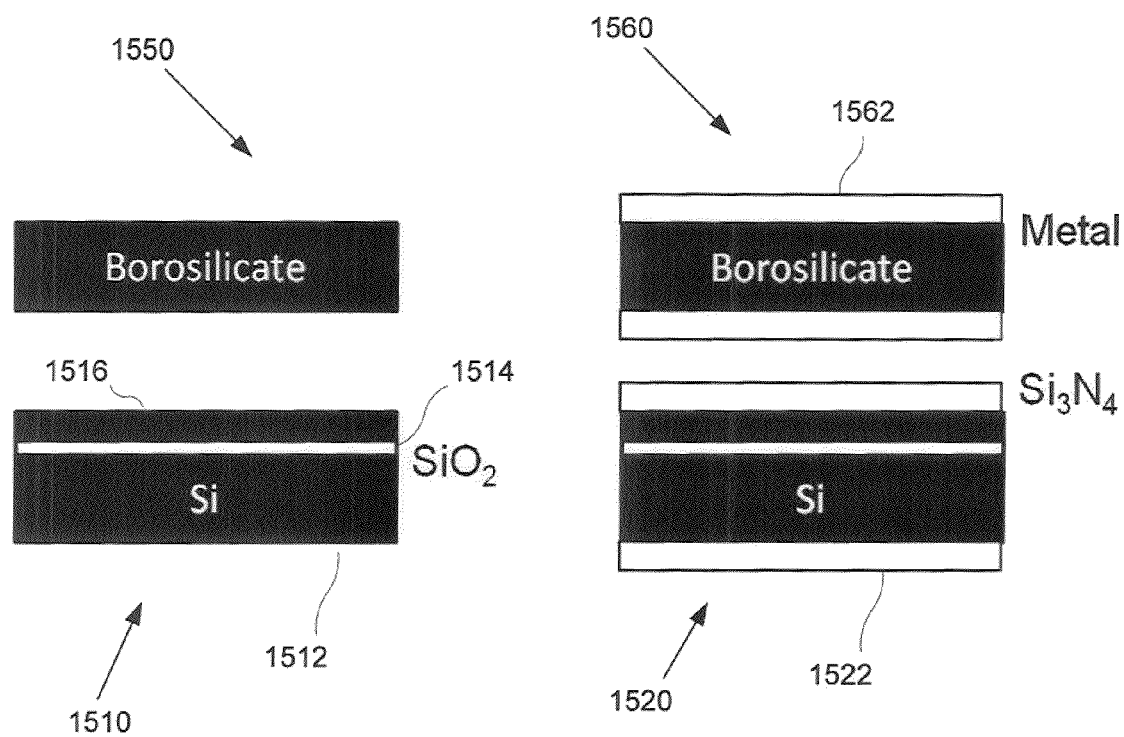
FIG. 15 shows a process flow for preparing silicon and borosilicate wafers for microfabrication.

FIG. 15 shows a process flow for preparing silicon and borosilicate wafers for microfabrication. Silicon on insulator (SOI) wafers 1510 may be obtained from Ultrasil Inc (Hayward, Calif.). The SOI wafer 1510 may be used to make the nozzle plate. As received, the wafers are 100 mm diameter, with a 100 μm thick Si device layer 1516 separated from a 315 μm thick Si handle layer 1512 by a 1-3 μm $SiO_2$ oxide layer 1514. Double side polished (DSP) 100 mm diameter, 500 μm thick borosilicate glass wafers 1550 are obtained from University Wafer (Cambridge, Mass.).

Masks for all four photolithographically defined patterns are produced using the LNF mask maker and the SOP for developing chrome masks. Prior to the start of photolithographic processing, an LPCVD $Si_3N_4$ hard mask layer 1522 is grown over the SOI wafers on both sides, as illustrated by wafer 1520. Similarly, a hard mask layer 1562 of 20 nm Cr/500 Au/20 nm Cr/500 nm Au is deposited on each side of the borosilicate glass wafers in preparation for etching, as illustrated by wafer 1560.

Figure 16:
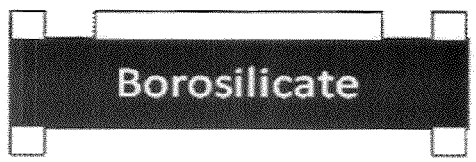
FIG. 16 shows steps of Si and borosilicate processing used to fabricate a print head.
Figure 16:
Figure 16:
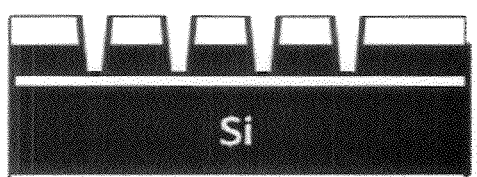
Figure 16:
Figure 16:
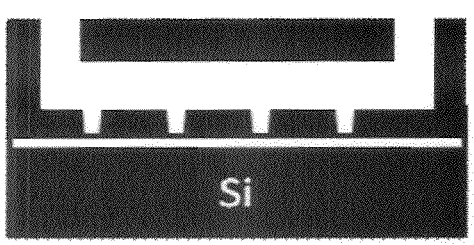
Figure 16:
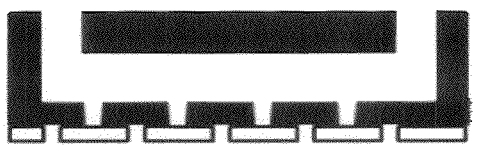
Figure 16:
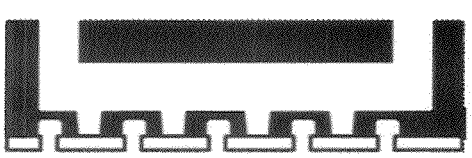
Figure 16:
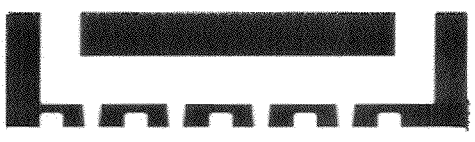

FIG. 16 shows steps of Si and borosilicate processing used to fabricate a print head.

The Si processing was as follows. The $Si_3N_4$ layer from FIG. 15 overlaying the SOI wafer is patterned with the nozzle inlet mask using SPR 220 photoresist. The $Si_3N_4$ layer over the nozzle inlets is then etched away with a 150 s deep reactive ion etch. The wafer is then etched in a 85° C., 50% by weight KOH solution for 100 min to form the inner tapered surfaces of the nozzles. The result of this step is shown in wafer 1630. Windows in the nozzle plate for displacement sensing and optical alignment are also cut at this time (not shown). The insulator layer of the SOI wafer forms an etch stop which defines the outlet of each nozzle. The $Si_3N_4$ layer is then removed with either a reactive ion etch or hot phosphoric acid etch. The result of this step is shown in wafer 1640.

The borosilicate processing was as follows, and was adapted from Ciprian Iliescu, F. E. H. Tay and J. Miao Sens. Act. A. 2 (133), 395-400 (2007). The metalized borosilicate glass wafers from FIG. 15 are coated on both sides with 10 μm AZ-9260 resist and photolithographically patterned with the channel pattern on one side and the via pattern on the other. The metal hard mask is then etched away with alternating dips on Transene GE-8148 gold etchant for 4 min and Cyantek CR-14 chromium etchant for 30 s. The result of these steps is shown in wafer 1610. The vias side of the wafer is affixed to a backing wafer with paraffin wax to protect it from etchant. The channel side is exposed. The wafer is immersed in 49% HF solution until the channels are etched to 100 μm. Etch depth is verified using a stylus profilometer. The desired amount of etching was achieved in approximately 15 min. The wafer is removed from its back and cleaned with hot trichloroethylene. The channel side is then affixed to the backing wafer with wax and the vias are etched using the HF solution. This etch goes through the wafer. The desired amount of etching was achieved in approximately an hour. The wafer is then cleaned with hot trichloroethylene and the metal mask is removed with gold and chromium etchants. The result of these steps is shown in wafer 1620. It should be appreciated that the illustrated cross section shows a channel having vias at each end, and that there are other regions of the wafer where there are no channels, vias, or both.

Anodic bonding is used to join the dissimilar layers of the print head. The order of bonding described is preferred for this particular embodiment due to the electrochemical nature of the anodic bonding process. Anodic bonding may be used to join a sodium containing glass to a metal or semiconductor. Once heated to 300-400° C., $Na^+$ in the glass becomes mobile. A potential of about 1000 V is applied from an anode under the metal layer to a cathode above the glass. Mobile carriers in the glass move away from the interface leaving an oppositely charged depletion region. The motion of cations leaves dangling oxygen atoms in the glass free to oxidize the metal interface, forming a chemical bond between the two materials. Anodic bonding is described in G. Wallis, Field Assisted Glass Sealing, 2(1), *Electrocomponent Science and Tech*, 1975 K. M. Knowles et al., Anodic bonding, 51(5), International Materials Rev., 2006.

The wafer bonding steps were as follows. The Borosilicate and Si wafers are prepared for bonding with a piranha clean. Afterward, the Si wafer is dipped in dilute HF to remove surface oxide. The wafers are then visually aligned and then placed in a Suss SB-6 Bonder. They are bonded in vacuum at a temperature of 400° C. by applying a voltage of 1000V for 20 min. The result of this step is shown in wafer stack 1650. The positive potential is applied to the Si side. In one embodiment, the back side of the borosilicate layer may be bonded to a Kovar backplane using anodic bonding. This may provide the print head with a more robust sealing surface.

Once bonded, the handle layer of the Si wafer is to be removed. The wafers are mounted to an aluminum chuck with paraffin wax. They are then submerged in a trilogy etch of 90% $HNO_3$, 9.5% HF, and 0.5% $CH_3COOH$ stock solutions. The wafer is continuously rotated and the etch bath is aerated with $N_2$ to ensure an even etch. The desired amount of etching was achieved in approximately 50 min, and etching is allowed to proceed until the $SiO_2$ etch stop is visible. The etch is preferably stopped promptly, due to the poor selectivity of trilogy etchant for Si over $SiO_2$. The wafers are removed from the chuck and remaining wax is dissolved with hot trichloroethylene. Since trilogy etchant does not strongly select for Si over $SiO_2$, a more selective finishing step is preferred. Remaining Si over the $SiO_2$ etch stop is removed with deep reactive ion etching (DRIE). DRIE is not used to remove all of the Si because it is significantly slower than trilogy etchant.

After handle layer removal, the $SiO_2$ covered underside of the wafer is coated with AZ-9260 photoresist and patterned so that regions that will be raised at the end of the process are covered with resist. Exposed $SiO_2$ is removed with a reactive ion etch (RIE). The result of this step is shown in wafer stack 1660. The non-raised portions are then etched 40 to 50 μm by DRIE. Completion of this etch is monitored by profilometery. The result of this step is shown in wafer stack 1670.

Afterward, photoresist is stripped and the remaining $SiO_2$ hard mask is removed with RIE.). The result of this step is shown in wafer stack 1680. Ohmic contacts consisting of 800 nm Al, 50 nm Pt, and 500 nm Au are evaporated onto opposite sides of the wafer to allow the wafer to be addressed by a heating current. An additional thin blanket coating of Ti can be added over the nozzle plate if the native Si is not sufficiently conductive for good heating. Finally, Cu foil leads are affixed to the electrodes with high temperature conductive epoxy.

The general structure of the OVJP print head and vapor generators as fabricated is as follows. Organic sources are stored at the end of glass stalks which are inserted into tubes that extend into a vacuum chamber and are heated at their far end. This system eliminates the problem of having to disconnect a high temperature seal, or undo a complex assembly, to refill material. OVJP operates at much higher pressures and much lower flow rates than OVPD, which may lead to a higher vapor residence time. The volume between the organic vapor sources and the nozzle array is kept as short as possible to eliminate unnecessary volume. Modeling indicates that separate source and dilution flows are not helpful at this length scale. As a result, there is no explicit provision for them, although these features could be readily added.

In one embodiment, the form factor of the OVJP system allows it to be attached to an 8" ConFlat port.

Heat boots are fabricated by first coating stainless steel tubes with a thin coat of Cotronics Resbond 919 high temperature ceramic adhesive. The coated region is 2 in wide and starts 0.125 from the tip of the tube. This coating provides a resistive surface on which to wrap Nichrome wire. A 0.005" diameter wire wrapped for 50 turns will give the heater a resistance of 220Ω. Once wrapped, the heater is sealed with another coat of Resbond 919 and cured overnight. The tubes can be plated with Ag if desired to reduce emissivity. These homemade heaters are compact and powerful, and do not produce particulates like fiberglass insulated heat tapes. Unlike commercial heat tapes, ceramic does not outgas once cured.

Figure 17:
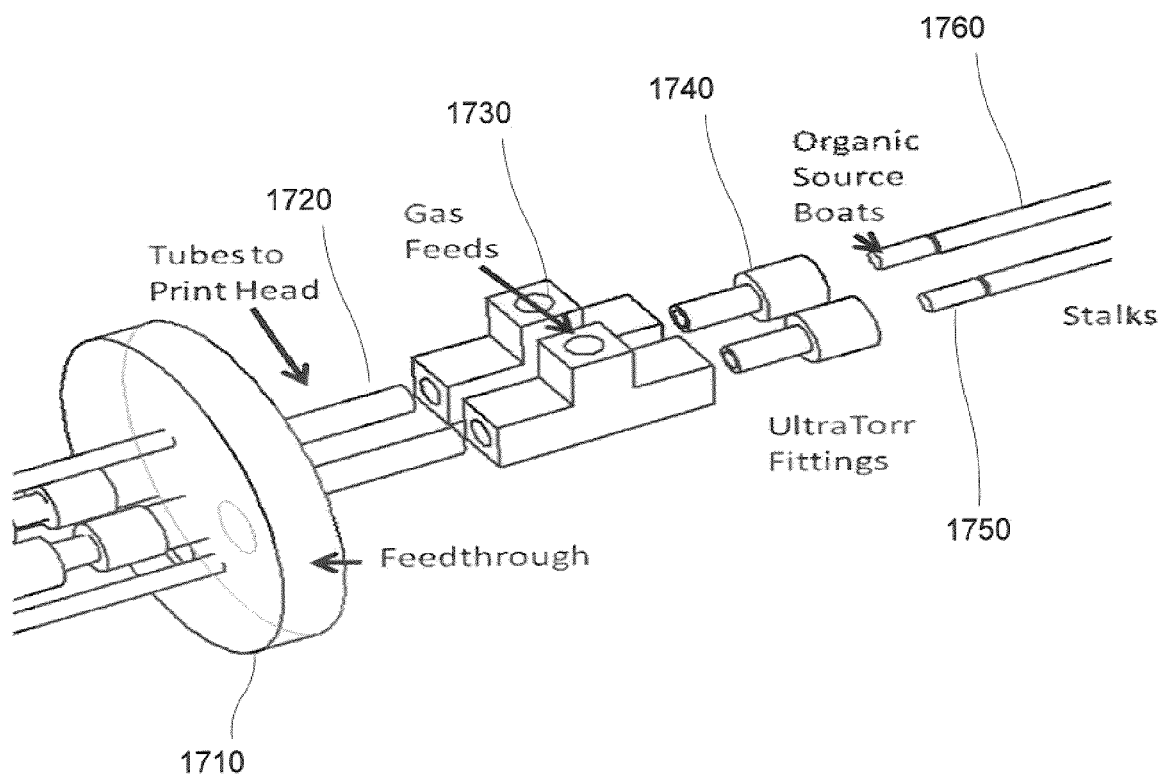
FIG. 17 shows an exploded drawing of an OVJP feedthrough.

FIG. 17 shows an exploded drawing of an OVJP feedthrough. Two organic vapor sources are illustrated for ease of illustration, but larger numbers of sources may be used, such as the six shown in FIG. 3, or even more. Manifold 1710 acts as a feedthrough, through which gas passes on its way to the print head, and through which organic source boats that are located very close to the print head during deposition may be easily and conveniently removed and replaced without breaking thermal seals. Tubes 1720 that lead to the print head, as illustrated in FIG. 3, extend from manifold 1710. Gas feeds 1730 may be attached to tubes 1720. Gas feeds 1730 may include ports for gas, as well as ports to allow for the passage of source boats. Ultra torr fittings 1740 are attached to gas feeds 1730, and provide an easily breakable and replaced hermetic seal through which source boats may be passed. Organic source boats 1750 are disposed on stalks 1760. Stalks 1760 may be inserted through ultra torr fittings 1740, gas feeds 1730, tubes 1720 and manifold 1710, and extended further through, for example, bellows 340 of FIG. 3 and related tubes until source boats 1750 are in close proximity to a print head. Ultra torr fittings 1740 provide a seal.

Specific non-limiting materials and dimensions that were used to fabricate an OVJP system are as follows. 0.375" steel tubes 1720 from manifold 1710 are terminated with swagelok T tube fittings (gas feeds 1730). Swagelok Ultratorr fittings 1740 are clamped into the far junction of the T fitting. A long glass stalk 1760 which contains an organic boat 1750 at its tip is inserted through the UltraTorr fitting 1740. Stalk 1760 extends all the way to the print head. Carrier gas is fed into the vapor generators from the middle connection of the T tube fittings.

It is preferred that a motorized x-y motion stage is provided to move the substrate relative to the nozzle array in order to draw patterned organic films using OVJP. The planes of the nozzle array and the substrate are preferably held as close to parallel as possible for the system to work well. For best results, substrate holder preferably has a flatness of >±1 μm per cm of linear travel. The bearings on which the substrate holder moves are preferably placed underneath the holder. The simplest arrangement would be to put two complete, stacked linear actuators inside the chamber. These actuators can sit on top of a dual tilt stage for fine leveling adjustment. This control can be manual, since alignment can be done prior to chamber evacuation. The z adjustment, however, is preferably motorized to provide height control. Because space within the chamber is at a premium, a z actuator is preferably incorporated with a vacuum linear positioner and mounted outside of the chamber. A manual rotation adjustment may similarly be mounted outside the chamber.

The OVJP system is preferably equipped with motorized x-y motion stages. Motion parallel to line orientation may be provided by a vacuum prepared Acrotech ATS-50 stage. Motion perpendicular to line orientation is may be provided by a Newport optical stage modified with a custom actuator.

The substrate holder may be made from aluminum with an anodized finish on top for compatibility with the non-contact height sensor. It sits on top of a copper cooling block which is fed liquid nitrogen coolant through flexible tubes. The holder can be removed through an adjacent glovebox to allow samples to be loaded and unloaded in an non-oxidizing environment. Thermal contact of substrate, holder, and cooling block may be enhanced with thin coatings of SPI Apezon cryo grease.

A PhilTech RZ-25 optical displacement sensor may look through a window in the print head to measure distance to the substrate. The sensor consists of a fiber optic bundle with emitter and receiver fibers. The coupling between the two fiber types is dependent on the distance between the bundle tip and a reflecting surface. The sensor tip is held by a fiber optic holder, which is in turn attached to one of the poles connecting the print head to the flange. The sensor signal is transmitted by an optical fiber bundle to a sensor outside of the chamber through a vacuum feedthrough.

Alignment with landmarks on the substrates is a preferred way to achieve positioning to overwrite features on the substrate. The print head preferably has separate windows to allow optical alignment. The chamber can be fitted with CCD cameras, appropriate lenses, lighting and software to allow alignment. These features are not present in current designs, but are well known and may be readily incorporated an OVJP system.

Figure 18:
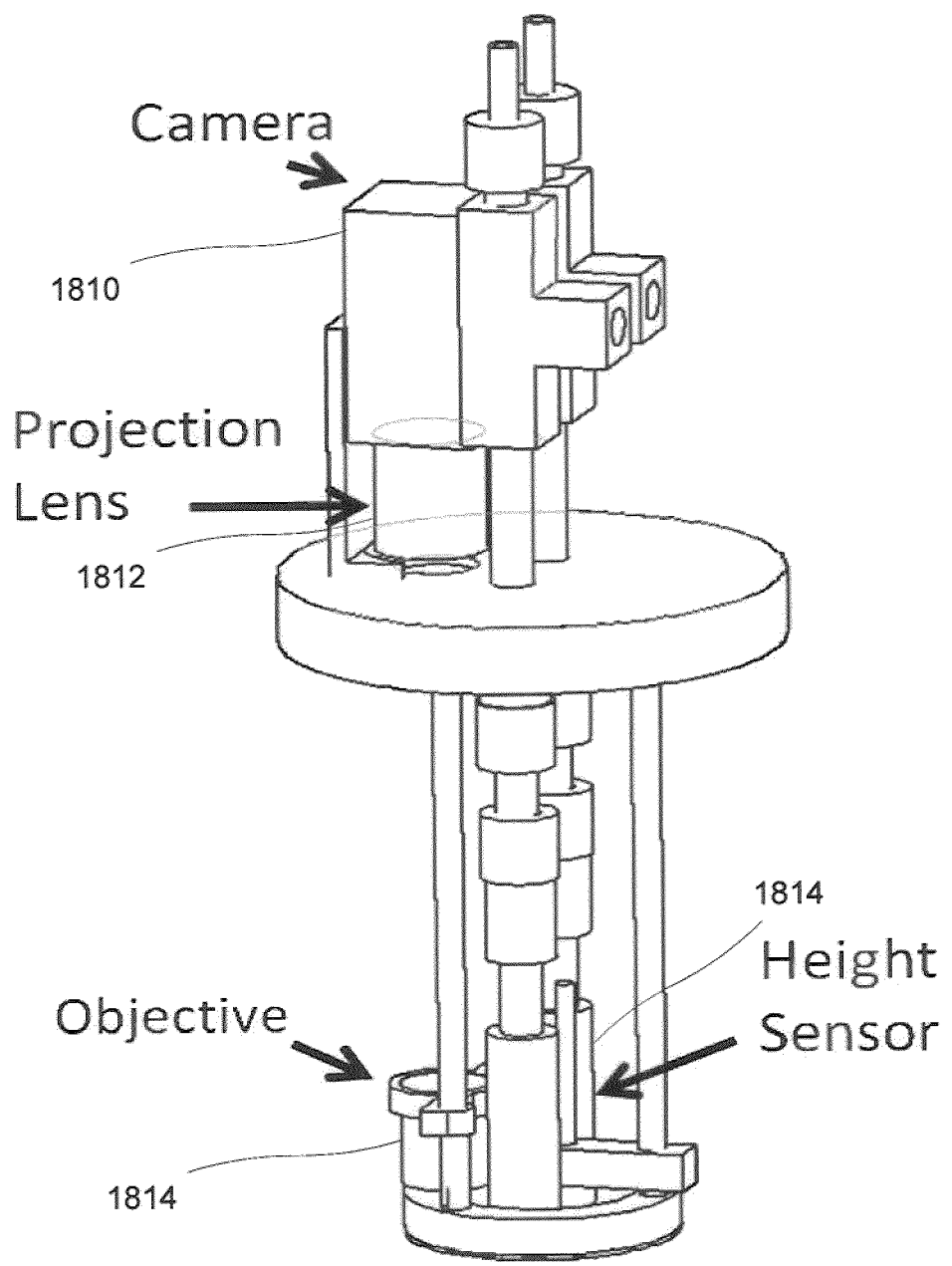
FIG. 18 shows a configuration of an OVJP system with alignment optics and height sensor installed.

FIG. 18 shows a configuration of an OVJP system with alignment optics and height sensor installed. The OVJP system has many of the same features that are illustrated in FIG. 17. In addition, the OVJP system of FIG. 18 includes a camera system useful for optical alignment. The camera system includes a camera 1810, projection lens 1812 and objective 1814. Appropriate openings may be readily provided in the manifold and print head. The OVJP system of FIG. 18 also includes a height sensor 1820. The configuration of FIG. 18 was not actually reduced to practice, but could be readily practiced based on the disclosure herein.

The OVJP system may be operated as follows.

The nozzle may be squared to the substrate plane, and the height sensor calibrated. The planes of the print head and substrate are made coincident with the print head at room temperature and the chamber vented. Front to back alignment is performed using a laser level and a mirror at the back of the substrate stage. Left to right alignment can be implemented using a feeler gauge to equalize the print head to substrate gap on each side of the substrate.

Organic material is spooned into a source boat at the tip of a borosilicate glass stalk. A thermocouple is threaded through the inner diameter of the stalk, to the stricture separating the stalk and boat and tightened in place. The stalk is inserted through the Ultratorr fitting at the top of the deposition chamber. The stalk is advanced until its tip is within 3 mm of the print head. The stop position is preferably measured in advance to prevent damage to the print head.

A substrate is placed in the vented chamber. Gas feed lines are opened to a bypass "Eustachian" tube which equalizes pressure between the print head vias and the chamber. The chamber is evacuated, and the OVJP is slowly heated to operating temperature. Once the OVJP is at high vacuum, a flow of $LN_2$ is established to the substrate stage. Finally the gas feed lines are scaled from the Eustachian tube.

After leveling the stage is lowered to give the nozzles room to move downward as the print head heats. The print head and vapor generators are then brought to operating temperature. Hard contact between the print head and substrate can be inferred based on either a sudden increase in the thermal load of the print head or by a sudden increase in organic source cell pressure when the print head is in use. The reading of the height sensor can now be zeroed.

Approximately 1 sccm of carrier gas is fed into each depositing source. Organic vapor sources should be heated to 200° C. to 300° C. depending on the material inside. The print head is heated to 300° C. The nozzle tips are brought to 10 μm of the substrate. A fine z adjustment may be locked into a feedback loop with the height sensor (not yet incorporated). The system is now depositing, and the patterns are governed by the motion of the x and y stage motors. Once the pattern is printed, deposition can be terminating carrier gas flow and reopening gas feed lines to the Eustachian tube.

Following deposition, the substrate is lowered away from the print head. The print head and organic source cells are both slowly cooled. All of these are preferably below 100° C. before the chamber is vented. The chilled stage is warmed above 0° C. as well.

Figure 19:
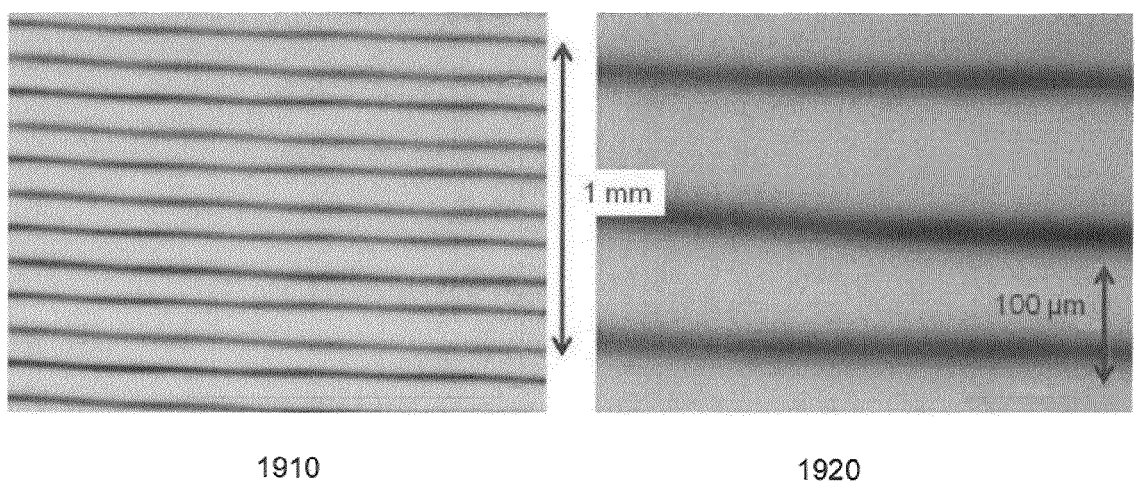
FIG. 19 shows optical micrographs of 35 nm thick lines of AlQ, Aluminum tris(quinoline-8-olate), drawn using the OVJP print head
Figure 20:
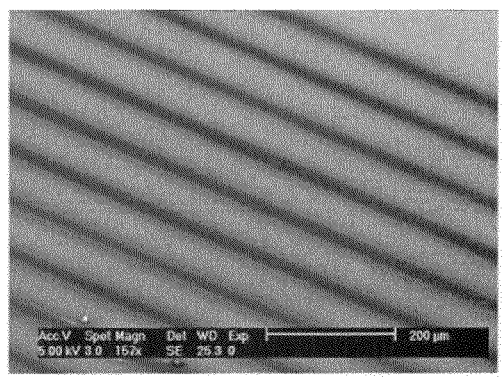
FIG. 20 shows SEM images of 35 nm thick lines of AlQ drawn using an OVJP print head
Figure 20:
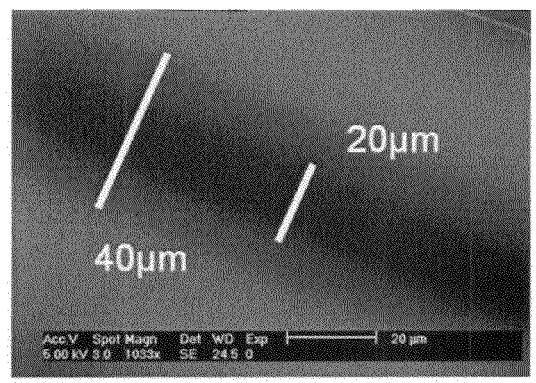
Figure 21:
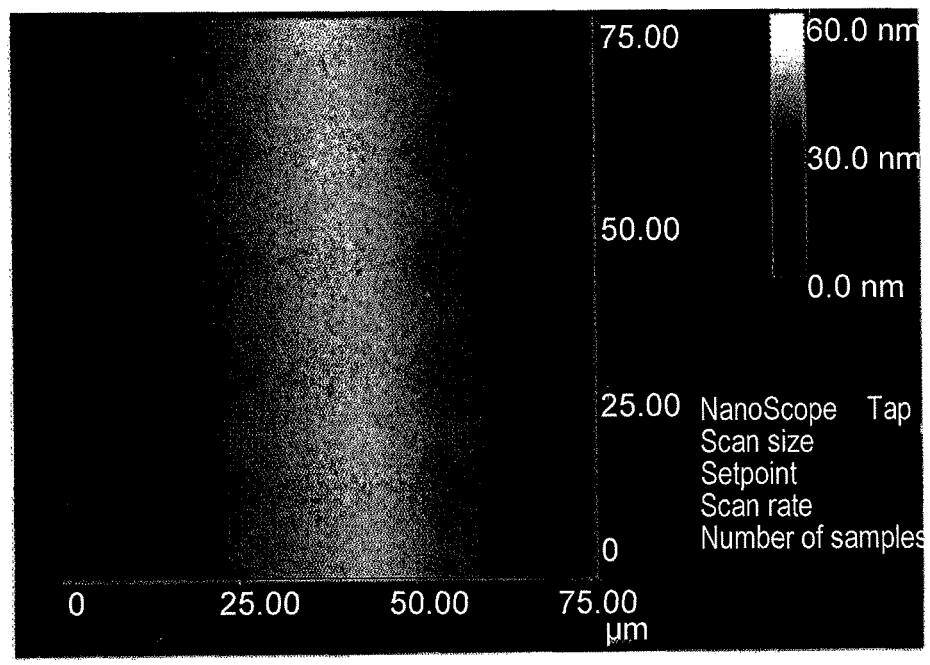
FIG. 21 shows atomic force micrograph images of 35 nm thick AlQ lines drawn using an OVJP print head.
Figure 21:
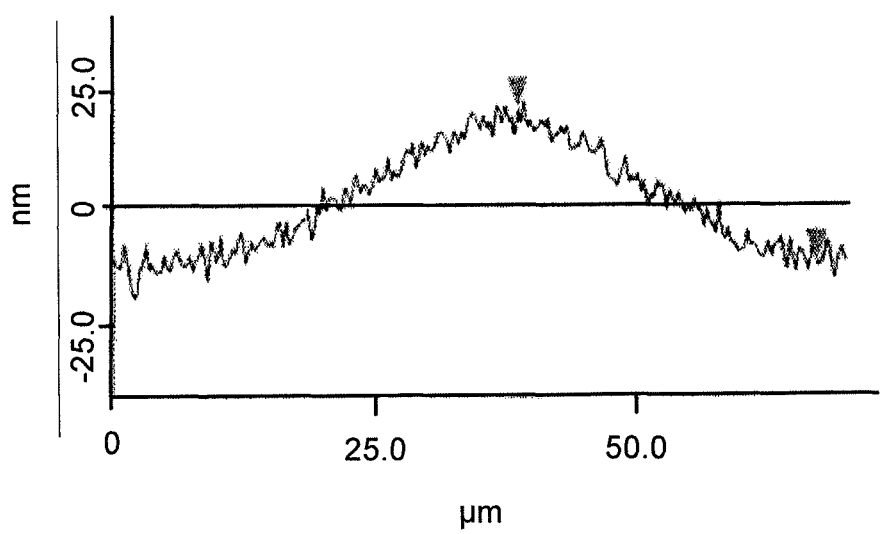

Preferred operating conditions include a chamber pressure of less than 1 mTorr and a substrate holder chilled to −100° C. Organic vapor is forced into the print head by a pressure of 1 to 50 Torr of inert gas at a flow rate of 1 standard cubic centimeter per minute per source via. Vapor can be mixed or diluted by combination of flow with other sources. The print head is maintained approximately 10 microns from the substrate surface. The substrate moves beneath the print head at a rate of 0.5 to 2 mm/s. Optical micrographs of lines of 35 nm thick Aluminum tris-(quinoline-8-olate) are shown in FIG. 19. Under preferred operating conditions, the print head can draw continuous lines organic material approximately 20 μm wide. FIG. 19 shows optical micrographs of 35 nm thick lines of AlQ, Aluminum tris(quinoline-8-olate), drawn using the OVJP print head, at two different magnifications (images 1910 and 1920). These lines are surrounded on each side by zones of extraneous deposition which are estimated to be no more than 10 μm wide. This is supported by scanning electron microscope (SEM) and atomic force microscope (AFM) images. FIG. 20 shows SEM images of the 35 nm thick lines of AlQ drawn using OVJP print head at two different magnifications (images 2010 and 2020). FIG. 21 shows atomic force micrograph of the 35 nm thick AlQ lines drawn with OVJP, including a two dimensional view where height is shown by grey scale (image 2110), and a trace of thickness in perpendicular to major axis of line using AFM (image 2120). Both width and thickness of the lines can be estimated from the cross sectional AFM trace.

To provide high resolution patterning of multicolor OLED arrays, OVJP is preferably capable of depositing material in tightly defined lines with minimal bleeding between lines. Indirect measurements of overspray of organic material in the regions between lines have been performed.

Figure 22:
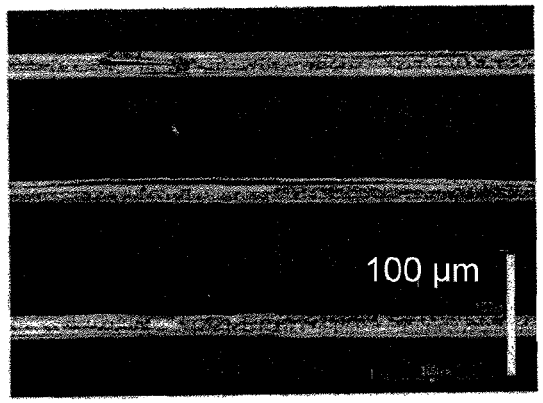
FIG. 22 shows optical micrograph and profilometer images of a thick line of material drawn using an OVJP print head.
Figure 22:
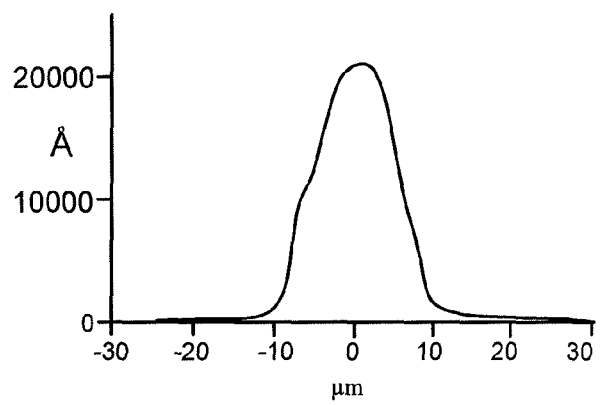

In one test, very thick lines were grown by moving the stage slowly beneath the print head. While these features are much thicker than those used in practical electronic devices, growing these lines allowed subtle features such as overspray tails to be magnified sufficiently to be measurable. The thickness cross section of these lines was then evaluated by profilometry. Lines were deposited having a thickness of up to 20000 angstroms (2 nm) in the region where deposition is desired. Beyond the measured 20 μm line width, overspray tails of 100 nm or less are measured that appear to extend for 10 μm beyond the line edge. These features are approximately 100 times thicker than would be found in OLEDs. Assuming that overspray thickness is proportional to feature thickness, this would imply that 1 nm or less of overspray can be expected in the proximity of drawn lines. FIG. 22 shows images of these lines, including an optical micrograph 2210 and a profilometer trace 2220.

Figure 23:
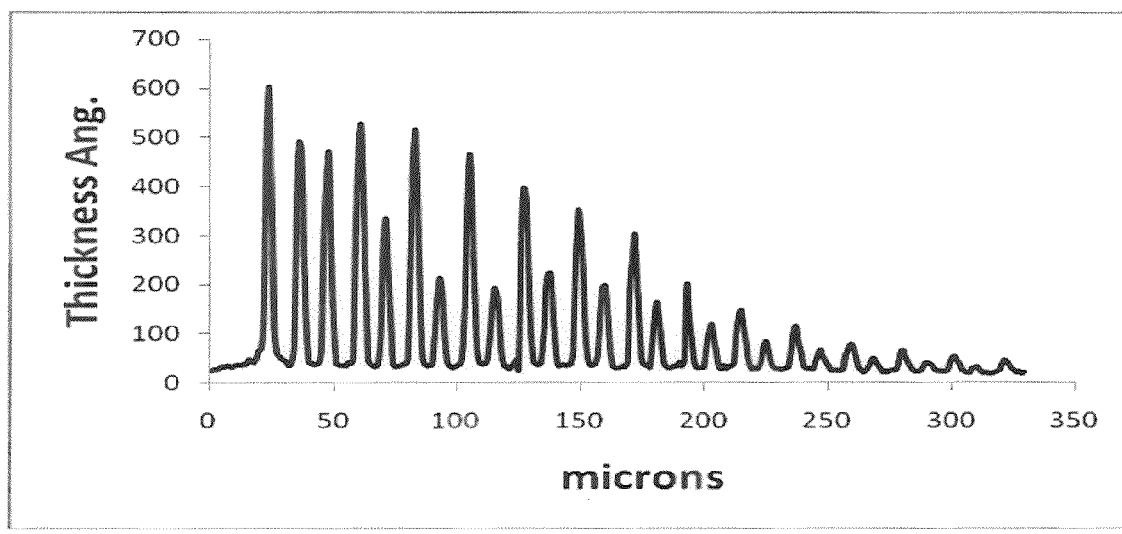
FIG. 23 shows linescan data from AlQ lines drawn using an OVJP print head.

Spatially resolved photoluminescence was used to probe overspray in the regions between thin film lines. Thickness calibrated measurements were taken on a specially constructed linescanning microscope. This system has a resolution of approximately 5 µm and a detection threshold of approximately 2 nm of AlQ tracer material. An initial scan revealed a background overspray of approximately 5 nm. Interestingly, the height of overspray does not appear to be correlated to distance from a line or the height of the nearest line. This suggests that the overspray was laid down at startup rather than during the actual printing and can be minimized by improving the startup procedure. The thickness of lines decreases significantly for nozzles further downstream of the organic material source. This is believed to be due to fabricating a particular print head with shallower fluidic channels to improve crack resistance, and the effect can readily be removed by using larger channels. Linescan data is shown in FIG. 23. FIG. 23 shows thickness corrected linescan data from OVJP drawn sample of AlQ.

Figure 24:
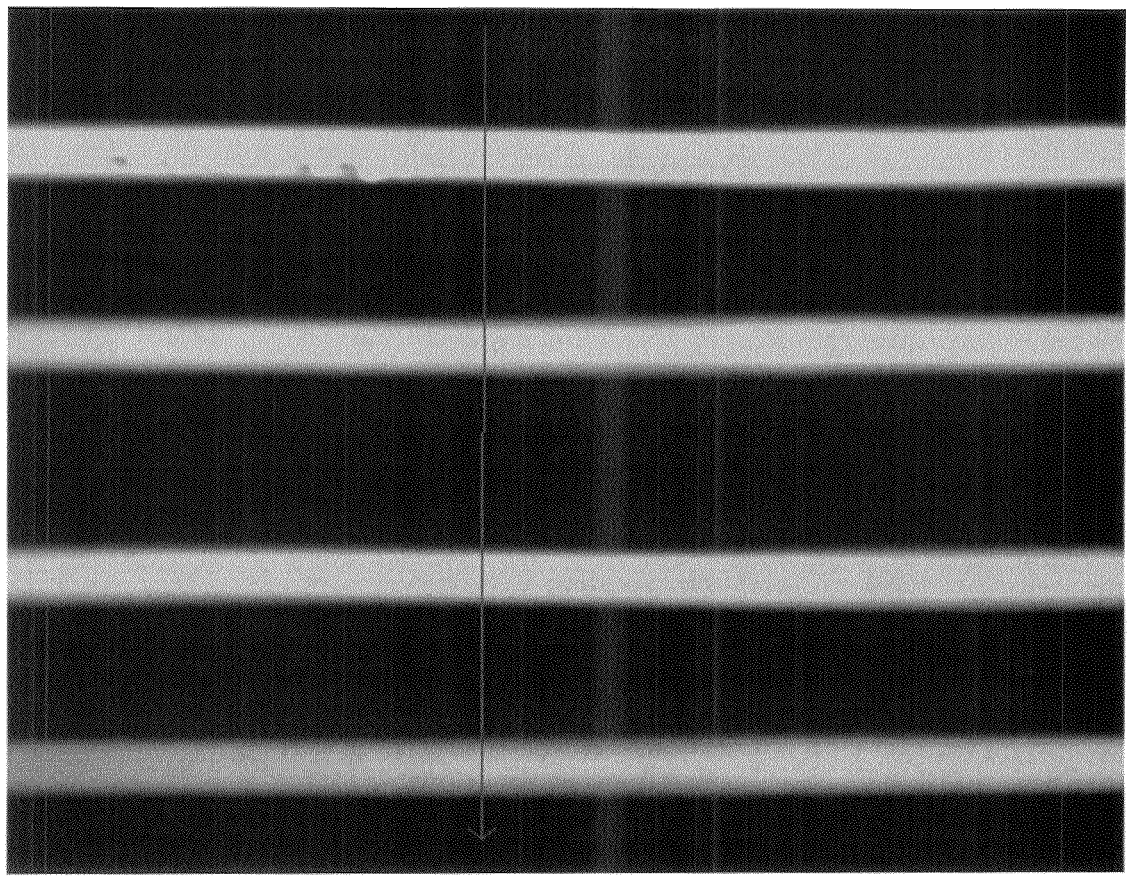
FIG. 24 shows a confocal epifluorescence micrograph of lines drawn using an OVJP print head.
Figure 24:
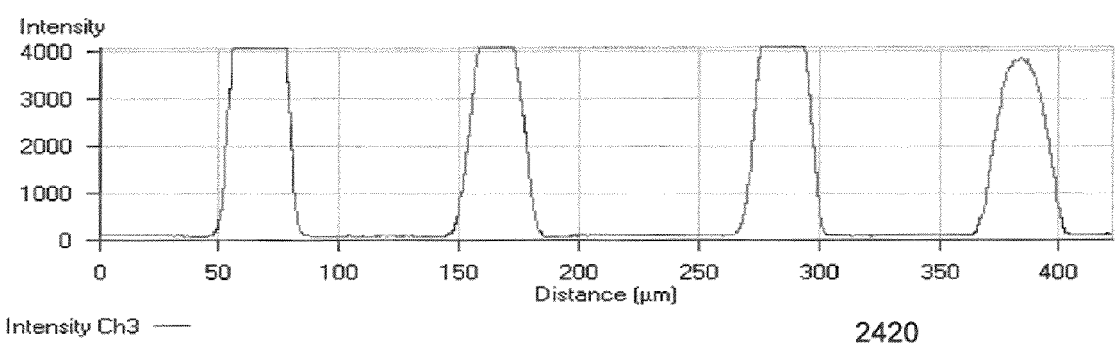

A Zeiss confocal epi fluorescence microscope at the Microscopy and Image Analysis Laboratory at the University of Michigan was used to probe overspray at higher spatial resolution. This microscope has a similar detection threshold to the linescanner but is otherwise much more capable. FIG. 24 shows a region of OVJP deposited lines analyzed using this system. Little or no signal was detected between the lines, suggesting an overspray thickness of 3 nm or less. While outputs from this tool are preferably calibrated with samples of known film thickness, the absence of signal from regions between lines suggests that little, if any, material is settling in these regions. FIG. 24 shows a confocal epifluorescence micrograph of OVJP drawn lines of AlQ. Image 2410 is a two dimensional image with fluorescent intensity shown by greyscale. The vertical arrow shows the direction of the intensity profile scan illustrated in image 2420, which shows the intensity of fluorescence along the line as function of distance.

It is understood that the various embodiments described herein are by way of example only, and are not intended to limit the scope of the invention. For example, many of the materials and structures described herein may be substituted with other materials and structures without deviating from the spirit of the invention. Inventive nozzle geometries described herein may be used in a wide variety of OVJP system configurations and print heads in addition to the specific embodiments illustrated herein. Similarly, inventive print head concepts described herein may be used in a wide variety of OVJP system configurations in addition to the specific embodiments illustrated herein. The present invention as claimed may therefore includes variations from the particular examples and preferred embodiments described herein, as will be apparent to one of skill in the art. It is understood that various theories as to why the invention works, and modeling of specific configurations, are not intended to be limiting.

The invention claimed is:

1. A device, comprising:
    a print head,
    a first gas source hermetically sealed to the print head;
    the print head further comprising:
        a first layer further comprising a plurality of apertures, each aperture having a smallest dimension of 0.5 to 500 microns;
        a second layer bonded to the first layer, the second layer further comprising a first via in fluid communication with the first gas source and at least one of the apertures, wherein the second layer is made of an insulating material, and
        the first layer further comprising a heat source, wherein the print head further comprises a microelectromechanical switch adapted to block or allow fluid communication between the first via and the at least one of the apertures depending upon the state of the switch.

2. The device of claim 1, wherein the first layer further comprising a channel that provides fluid communication within the first layer between the first via of the second layer and apertures of the first layer.

3. The device of claim 1, further comprising a third layer disposed between the first and second layers and bonded to the first layer and the second layer wherein the third layer further comprises a channel that provides fluid communication between the first via of the second layer and apertures of the first layer.

4. The device of claim 3, wherein the third layer further comprises a heat source.

5. The device of claim 1, wherein a plurality of apertures are in fluid communication with the first gas source.

6. A device, comprising:
    a print head;
    a first gas source hermetically sealed to the print head; and
    a second gas source hermetically sealed to the print head,
    the print head further comprising:
        a first layer comprising a plurality of apertures, each aperture having a smallest dimension of 0.5 to 500 microns;
        a second layer bonded to the first layer, the second layer comprising a first via in fluid communication with the first gas source and at least one of the apertures,
        wherein the second layer is made of an insulating material,
        wherein the first via of the second layer is in fluid communication with a first group of apertures of the first layer, and
        the second layer further comprises a second via in fluid communication with the second gas source and a second group of apertures of the first layer.

7. The first device of claim 6, wherein: the first device further comprises a third gas source hermetically sealed to the print head, and the second layer further comprises a third via in fluid communication with the third gas source and a third group of apertures of the first layer.

8. A device, comprising:
    a print head; and
    a first gas source hermetically sealed to the print head,
    the print head further comprising:
        a first layer comprising a plurality of apertures, each aperture having a smallest dimension of 0.5 to 500 microns;
        a second layer bonded to the first layer, the second layer comprising a first via in fluid communication with the first gas source and at least one of the apertures,
        wherein the second layer is made of an insulating material,
        wherein, the first via is in fluid communication with a first organic source;
    a second via is in fluid communication with a second organic source;
    the first and second vias are both in fluid communication with a first group of apertures of the first layer; and
    the print head, the first organic source and the second organic source each have independently controllable heat sources.

9. The first device of claim 8, further comprising a first valve for controlling gas flow to the first organic source and a second valve for controlling gas flow to the second organic source, wherein the first and second valves are thermally insulated from the heat sources.

10. The first device of claim 1, wherein the first layer is formed from a semiconductor.

11. The first device of claim 1, wherein the first layer is formed of silicon.

12. The first device of claim 1, wherein the first layer is bonded to the second layer using a bond selected from the group consisting of a cold weld, an anodic bond, and a eutectic bond.

13. The device of claim 1, wherein the print head further comprises a microelectromechanical switch adapted to block or allow fluid communication between the first via and the at least one of the apertures depending upon the state of the switch.

14. A device, comprising:
a print head; and
a first gas source hermetically sealed to the print head,
the print head further comprising:
a first layer further comprising a plurality of apertures, each aperture having a smallest dimension of 0.5 to 500 microns; and
a second layer bonded to the first layer, the second layer further comprising a first via in fluid communication with the first gas source and at least one of the apertures, wherein the second layer is made of an insulating material, and
the first layer further comprising a heat source, wherein at least one aperture is formed in a protrusion from the print head.

15. The first device of claim 1, wherein the thickness of the print head is between 50 and 500 microns.

16. The first device of claim 1, wherein the second layer further comprises a channel that provides fluid communication within the second layer between the first via of the second layer and apertures of the first layer.

* * * * *